(12) United States Patent
Otterstedt et al.

(10) Patent No.: US 8,344,429 B2
(45) Date of Patent: Jan. 1, 2013

(54) COMPACT MEMORY ARRAYS

(75) Inventors: Jan Otterstedt, Unterhaching (DE); Thomas Nirschl, Munich (DE); Michael Bollu, Kirchheim (DE); Wolf Allers, Munich (DE)

(73) Assignee: Infineon Technologies AG, Neubiberg (DE)

( * ) Notice: Subject to any disclaimer, the term of this patent is extended or adjusted under 35 U.S.C. 154(b) by 73 days.

(21) Appl. No.: 12/212,097

(22) Filed: Sep. 17, 2008

(65) Prior Publication Data

US 2010/0065891 A1 Mar. 18, 2010

(51) Int. Cl.
*H01L 23/52* (2006.01)

(52) U.S. Cl. .................. 257/211; 257/E23.141

(58) Field of Classification Search ............ 257/211
See application file for complete search history.

(56) References Cited

U.S. PATENT DOCUMENTS

| | | | |
|---|---|---|---|
| 5,841,688 A | 11/1998 | Sukegawa et al. | |
| 5,909,388 A | 6/1999 | Mueller | |
| 5,933,725 A | 8/1999 | Kirsch et al. | |
| 6,141,236 A | 10/2000 | Kengeri | |
| 6,266,264 B1 | 7/2001 | Proebstring | |
| 6,611,062 B2 | 8/2003 | Kurjanowicz | |
| 6,759,290 B2 | 7/2004 | Ogura et al. | |
| 7,042,030 B2 | 5/2006 | Balasuramanian et al. | |
| 7,193,266 B2 | 3/2007 | Roohparvar | |
| 7,327,594 B2 | 2/2008 | Jacquet | |
| 2001/0028080 A1* | 10/2001 | Himeno et al. ............... | 257/315 |
| 2002/0131290 A1 | 9/2002 | Vo | |
| 2005/0122776 A1 | 6/2005 | Lee et al. | |
| 2007/0121359 A1* | 5/2007 | Kanda ............................. | 365/51 |
| 2007/0126052 A1 | 6/2007 | Luan et al. | |
| 2007/0252192 A1 | 11/2007 | Mokhlesi et al. | |
| 2008/0084729 A1* | 4/2008 | Cho et al. ...................... | 365/72 |

* cited by examiner

*Primary Examiner* — Jarrett Stark
*Assistant Examiner* — Lawrence Tynes, Jr.
(74) *Attorney, Agent, or Firm* — Slater & Matsil, L.L.P.

(57) ABSTRACT

Embodiments of the invention describe compact memory arrays. In one embodiment, the memory cell array includes first, second, and third gate lines disposed over a substrate, the second gate lines are disposed between the first and the third gate lines. The first, the second, and the third gate lines form adjacent gate lines of the memory cell array. The memory cell array further includes first metal lines disposed over the first gate lines, the first metal lines coupled to the first gate lines; second metal lines disposed over the second gate lines, the second metal lines coupled to the second gate lines; and third metal lines disposed over the third gate lines, the third metal lines coupled to the third gate lines. The first metal lines, the second metal lines and the third metal lines are disposed in different metallization levels.

4 Claims, 28 Drawing Sheets

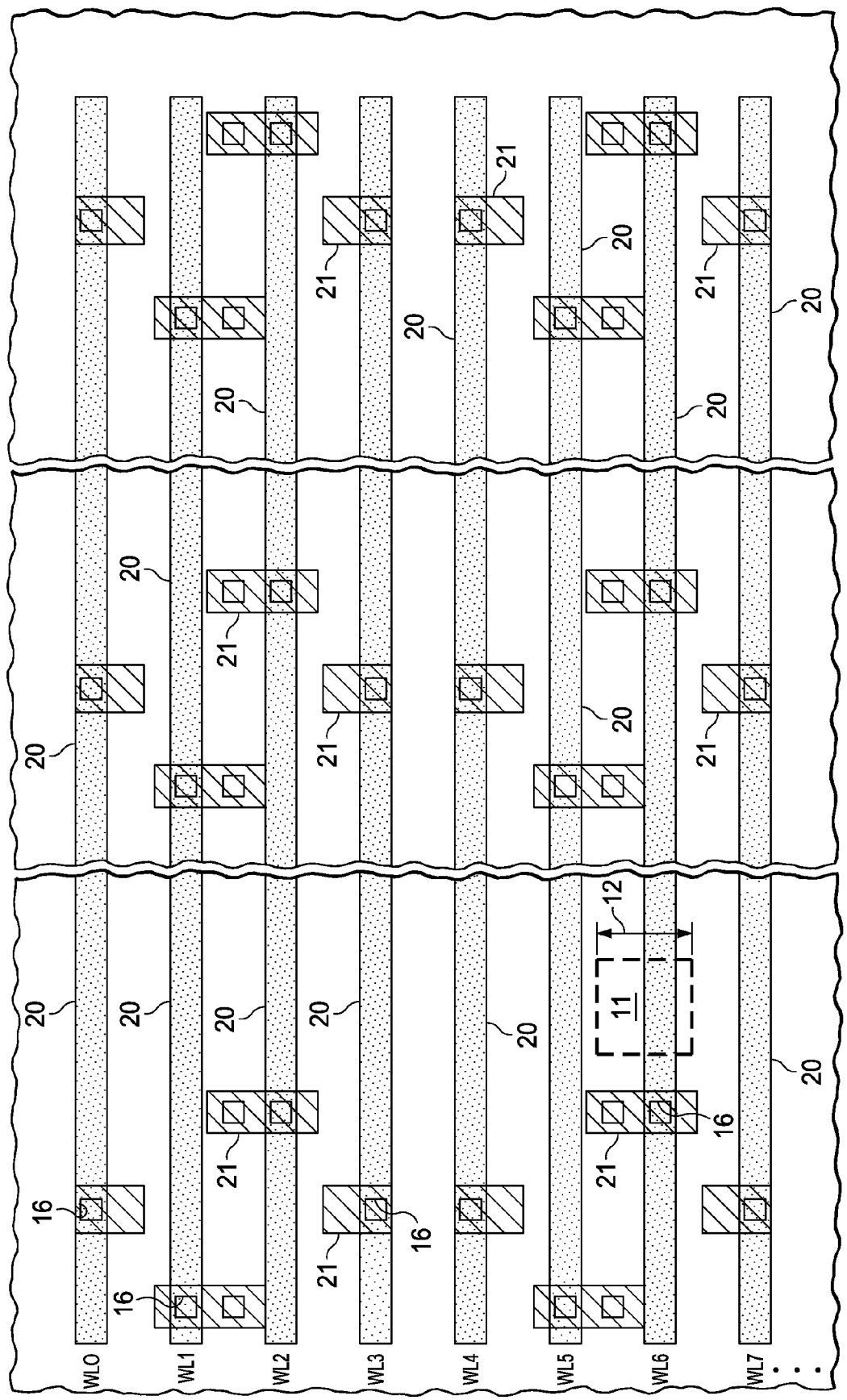

COMPACT MEMORY ARRAYS

TECHNICAL FIELD

The present invention relates generally to semiconductor components, and more particularly to compact memory arrays.

BACKGROUND

Generally, semiconductor devices are used in a variety of electronic applications, such as computers, cellular phones, personal computing devices, and many other applications. Home, industrial, and automotive devices that, in the past, comprised only mechanical components now have electronic parts that require semiconductor devices, for example.

There is a trend in the semiconductor industry towards scaling. Scaling requires reduction in component size, for example, by reducing the size of features, e.g., the circuits, elements, conductive lines, and vias of semiconductor devices, in order to increase performance of the semiconductor devices while increasing density. The minimum feature size of semiconductor devices has steadily decreased over time. However, as features of semiconductor devices become smaller, it becomes more difficult to aggressively scale all features to achieve the necessary shrink in die size. Hence, alternative strategies to scaling are needed.

One way to achieve scaling without reducing feature size is to improve design of circuits to overcome the limitations introduced by processes. One way of improving circuits requires improving the layout of the circuits. Improvements in layout design can help share the burden of scaling. However, layout changes are susceptible to yield loss arising from electrical shorts etc. Hence, what are needed are layout changes to achieve scaling without compromising process yield.

SUMMARY OF THE INVENTION

These and other problems are generally solved or circumvented, and technical advantages are generally achieved, by preferred embodiments of the present invention which include compact memory cell arrays.

Embodiments of the invention include memory cell arrays comprising word line stitching disposed in multiple metallization layers. In accordance with a preferred embodiment of the present invention, a memory cell array comprises first, second, and third gate lines disposed over a substrate, the second gate lines disposed between the first and the third gate lines, and wherein the first, second, and third gate lines form adjacent gate lines of the memory cell array. The memory cell further comprises first metal lines disposed over the first gate lines, the first metal lines coupled to the first gate lines; second metal lines disposed over the second gate lines, the second metal lines coupled to the second gate lines; and third metal lines disposed over the third gate lines, the third metal lines coupled to the third gate lines, wherein the first metal lines, the second metal lines and the third metal lines are disposed in different metallization levels.

The foregoing has outlined, rather broadly, the features of an embodiment of the present invention so that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes FIGS. 2a-2e, illustrates a memory cell array using word line stitching, wherein FIG. 2a illustrates a top view and FIGS. 2b-2e illustrate cross sectional views, in accordance with an embodiment of the invention;

FIG. 3, which includes FIGS. 3a-3d, illustrates a memory cell array using word line stitching, wherein FIG. 3a illustrates a top view and FIGS. 3b-3d illustrate cross sectional views, in accordance with an embodiment of the invention;

FIG. 4, which includes

FIG. 6, which includes FIGS. 6a-6e, illustrates a memory cell array using word line stitching, wherein FIG. 6a illustrates a top view and FIGS. 6b-6e illustrate cross sectional views, in accordance with an embodiment of the invention;

FIG. 7, which includes FIGS. 7a-7c, illustrates the layout of FIG. 6, illustrating coupling to each metal level separately;

FIG. 9, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a compact memory array formed by word line stitching using multiple metallization layers. The invention may also be applied, however, to other conductors as well as other semiconductor components and devices.

Figure 1:
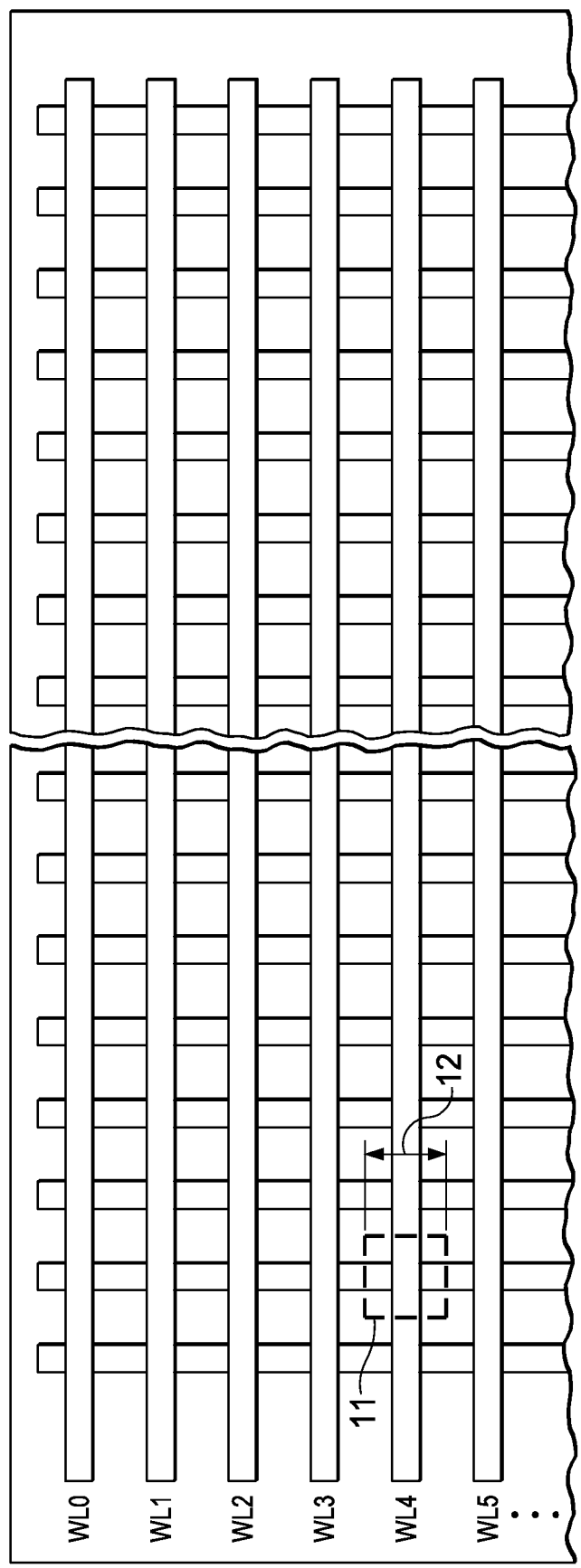
FIG. 1 is a high density memory array illustrating a memory cell and word lines.

Scaling memory circuits requires scaling memory cell size without compromising performance metrics. FIG. 1 illustrates a memory cell 11 formed in an active region. A memory cell 11 is scaled by about 50% from one technology generation to the next without compromising performance, and in many technologies improving performance with each subsequent technology node. Designing such memory cells requires maximizing performance (for example, minimizing delay and power consumption) while reducing the size of the integrated circuit to improve density.

Scaling the memory cell requires scaling all the features of the circuit from the prior technology node. This requires scaling the cell height 12 (FIG. 1), which defines the area of the memory cell 11. Ideally, the distance between the gate lines or control gates (minimum poly pitch) defines the cell height 12 of the memory cell 11. However, laying out a memory cell with a memory cell height at minimum poly pitch introduces additional challenges if performance boosting solutions as detailed below are adopted.

One of the challenges in improving the performance of the memory circuits relates to decreasing parasitic resistance and capacitance of interconnecting conductive lines. One of the critical bottlenecks is the parasitic resistance of the word lines coupling the gate or control gates of individual transistors in a memory array. Word lines typically comprise long poly silicon lines. The larger resistance of poly silicon relative to metals results in significant resistive loss through the word lines. For example, in FIG. 1, the word lines (WL0, WL1, WL2, WL3, WL4, WL5) are word lines formed from poly silicon lines. The word lines are oriented perpendicular to the bitlines as illustrated in FIG. 1.

One way of reducing the resistance of the poly silicon lines is to "stitch" the poly silicon lines by introducing metal lines. In stitching, the word lines are formed by stitching together a low resistance conductor to a high resistive conductor (poly gate line) by the use of inter-dielectric contacts or contact plugs. In word line stitching, contact plugs couple the poly silicon gate lines to a metal line immediately above the poly silicon gate lines so that the current path is through the low resistive lines (e.g., metal lines), thus avoiding the higher resistive poly silicon lines.

The use of word line stitching increases the speed at which the potential on the word line can be switched since speed is limited by the value of the RC product of the word line. Since the sheet resistance of the metal lines is substantially lower than the sheet resistance of the material forming the gate conductor, the use of word line stitching greatly reduces the resistance at the expense of little additional capacitance. Thus, the value of the RC product is greatly reduced, enabling an increase in the switching speed of the word line.

Although the use of the word line stitching improves performance, the implementation of such a scheme requires a stitch region for accommodating contacts between the metal lines and the poly silicon gate lines. The contacts employed to stitch the metal lines of a word line to its poly silicon gate lines are disposed in the stitch regions which are located adjacent to the memory arrays and typically disposed between adjacent columns of memory arrays. However, in the regions over the contact plugs or vias, metal lines are patterned larger than their normal line width. For good contact formation, the width of the metal lines is increased locally. Hence, this local increase in metal line width limits the allowed minimum distance between adjacent metal lines (contacted metal pitch). As the wordlines are now coupled to the metal lines, the minimum distance between the word lines is also limited to the contacted metal pitch (even in the memory array).

Hence, scaling of the cell size is limited by the contacted metal pitch. This is very disadvantageous as the minimum contacted pitch of the poly gate lines may be much lower than the minimum contacted pitch of metal lines. In other words, although the poly lines can be patterned closer, word line stitching prohibits leveraging this additional area. Hence, in technologies using word line stitching, the poly gate lines are patterned only up to the contacted metal pitch for the first metal level. Use of word line stitching forces a compromise between performance and scaling.

In various embodiments, as described in the present disclosure, this compromise between performance and scaling is avoided by introducing a multilevel metallization scheme that separates the minimum pitch requirement of each individual metal level from the minimum pitch of the word lines. In word lines, neighboring word lines are coupled to different metal levels thus decoupling the minimum pitch of poly with the minimum contacted pitch of any metal level.

Structural embodiments of the layout are illustrated using FIGS. 2, 3, 5, 6, 8, and 9. Top cross views illustrating formation of individual word line stitching in a single metal level are illustrated using FIGS. 4 and 7 to describe individual layers (or mask layout for each metallization level) with respect to the gate lines.

Figure 2A:
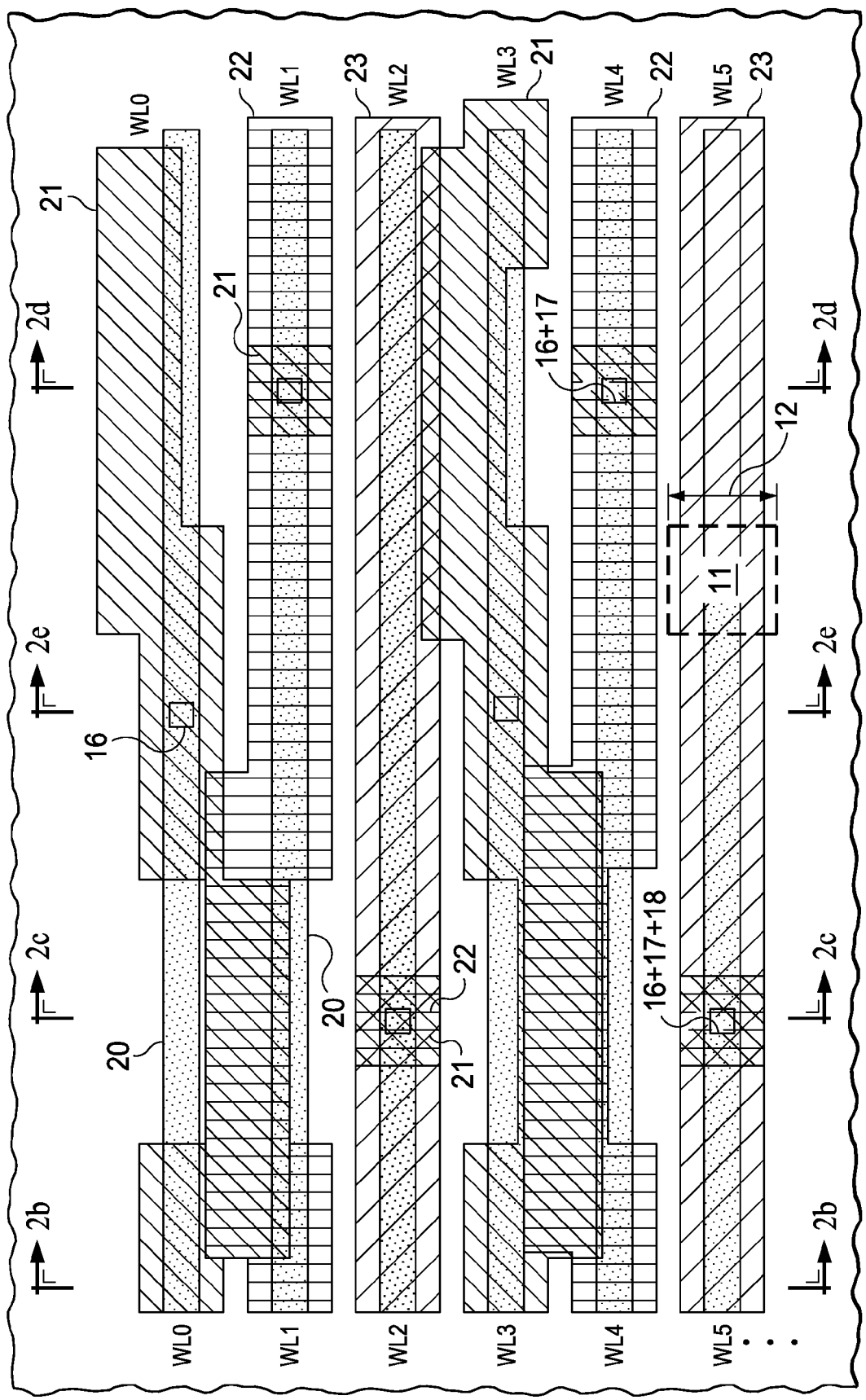

FIG. 2, which includes FIGS. 2a-2e, illustrates a layout of a memory cell array in an embodiment of the invention. FIG. 2a illustrates the top view and illustrates all the layers overlaid together, whereas FIGS. 2b-2e illustrate corresponding vertical cross sectional views.

Referring to FIG. 2a, the memory cell array 1 comprises an array of memory cells 11. Each memory cell has a memory cell height 12 that describes the cell dimension and hence the size or area of the memory cell. The gate lines 20 form the word lines (WL0, WL1, WL2, WL3, WL4, and WL5) and are disposed over an active region. The active region of the memory cell array further possibly comprises active devices including transistors, diodes, capacitors and resistors.

FIGS. 2b-2e illustrate cross sectional views of FIG. 2a. As illustrated in cross sectional views of FIGS. 2b-2e, the gate lines 20 are coupled to either of the first metal lines 21, the second metal lines 22 or the third metal lines 23. In one embodiment, the first metal lines 21 are formed over the gate lines 20 of the first and fourth word lines WL0 and WL3. The first metal lines 21 are also coupled to the corresponding word lines underneath and form a portion of the first and fourth word lines WL0 and WL3. The second metal lines 22 are disposed above the gate lines 20 of the second and fifth word lines WL1 and WL4. The second metal lines 22 form a portion of the second and fifth word lines WL1 and WL4. Similarly, the third metal lines 23 are disposed above the gate lines 20 of the third and sixth word lines WL2 and WL5. The third metal lines 23 form a portion of the third and sixth word lines WL2 and WL5.

Figure 2B:
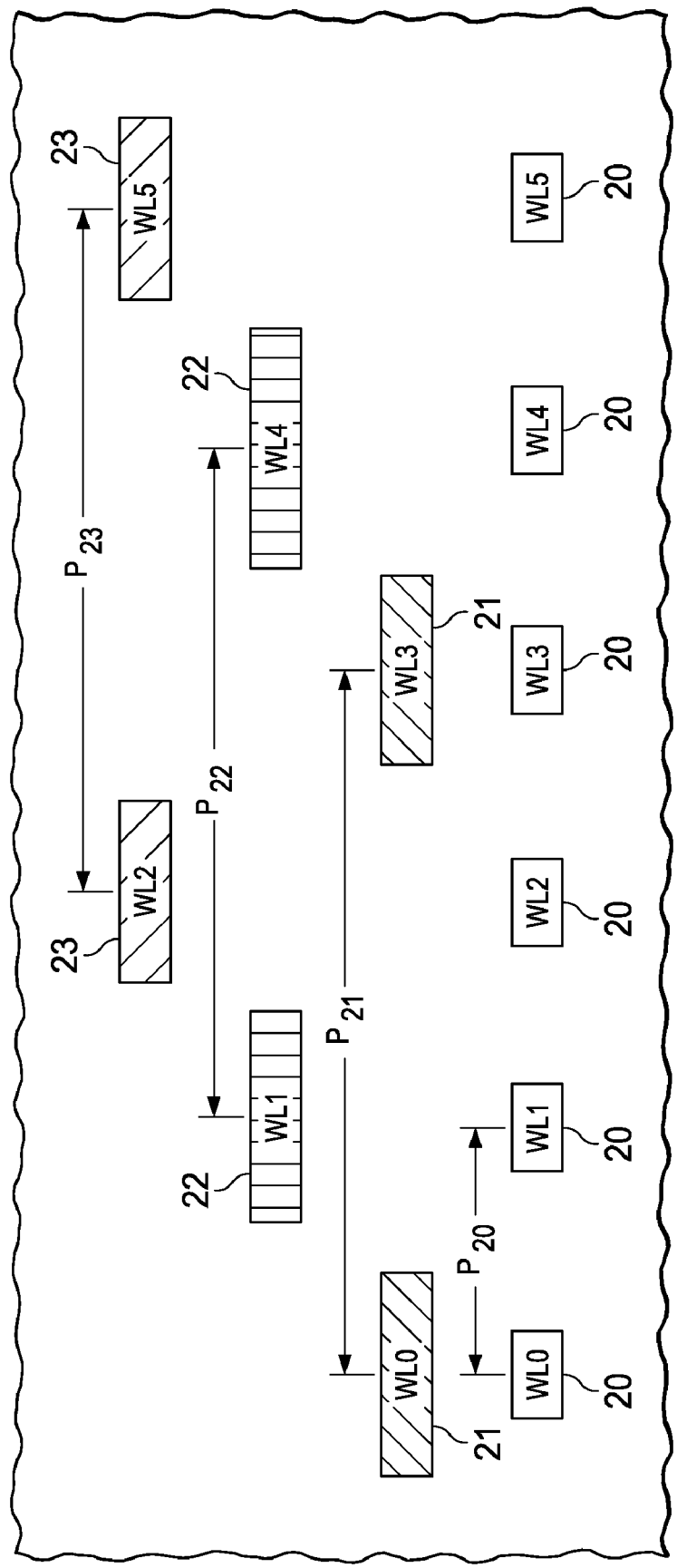

The cell height 12 (of a different cell) in the memory cell array formed in FIG. 2a is also illustrated in FIG. 2b. Further, in various embodiments, the cell height 12 is also the minimum distance allowed between the gate lines 20. Further, the distance between the middle lines of the first metal lines 21 ($P_{21}$), the second metal lines 22 ($P_{22}$), and the third metal lines 23 ($P_{23}$) is marked on FIG. 2b. It is evident from the illustration that the gate lines 20 are packed closer together than any of the metal lines. In other words, the pitch between poly is less than the minimum pitch of the other metal levels i.e. $P_{20} < P_{21}$, $P_{22}$, or $P_{23}$.

This is accomplished by coupling multiple metal lines in word line stitching to the gate lines 20. By coupling to multiple metal lines, each metal level is laid out at a pitch that is equal or greater than the minimum contacted pitch for that metal level. Ideally, as metal lines in different layers can overlap partially or substantially, three metal lines are routed in the space normally available for only one metal line, and the poly gate lines can be patterned at minimum contacted poly. For example, in an embodiment in which the metal lines are coupled to the gate lines 20 vertically without any additional space for the contacting and without a change in spacing.

However, in reality, additional space is allotted to connect the higher metal levels down to the gate lines 20. This requires intermediate metal spots in the metal layers between the higher metal levels and the gate lines 20. Hence, metal lines coupling to the other gate lines 20 are moved away to prevent shorting to the higher metal levels, thereby allowing sufficient space for placing the intermediate metal spots. In FIG. 2a, this is visualized by the bends in the first and the second metal lines 21 and 22.

Figure 2C:
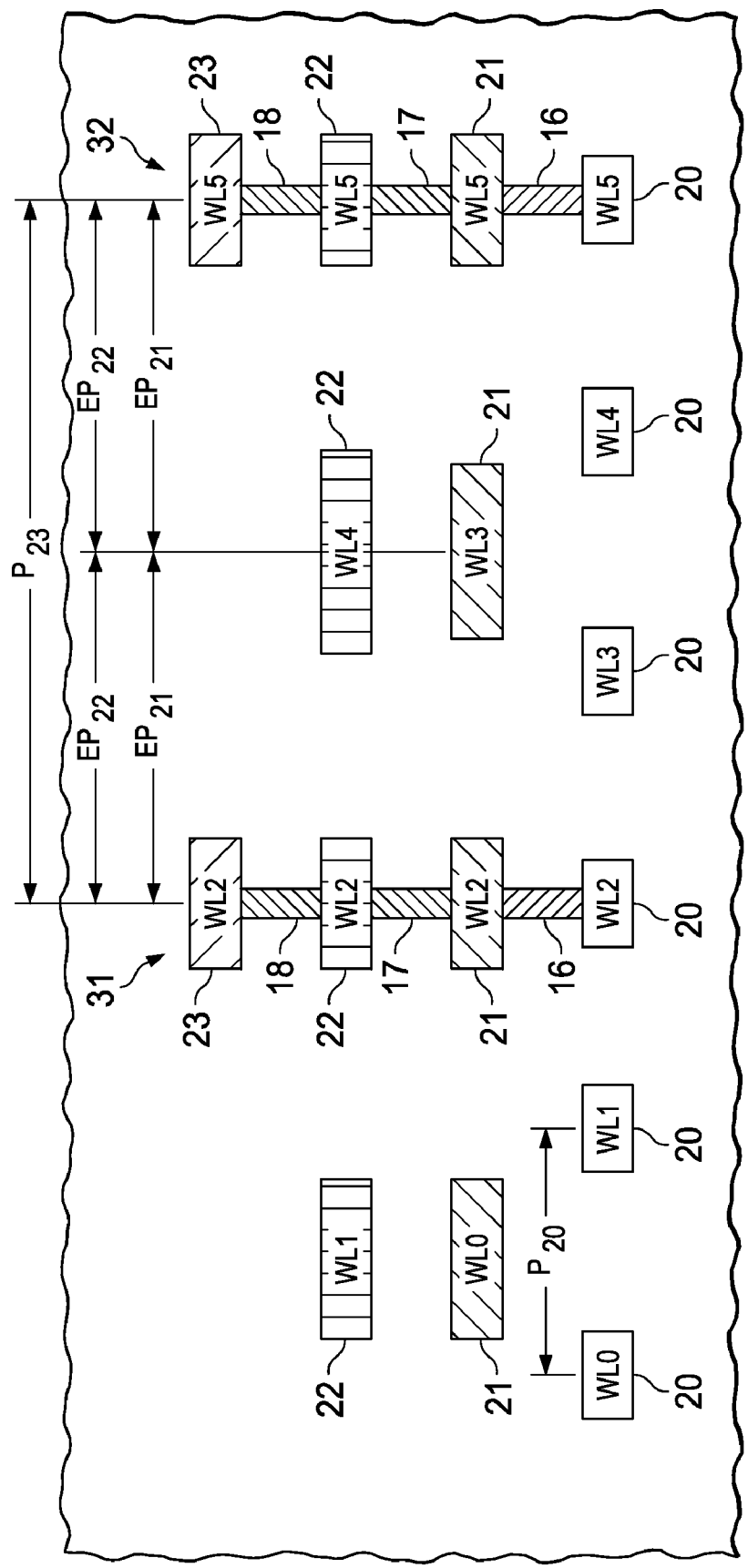

Referring next to FIG. 2c, the third metal line 23 couples to a poly gate line 20 forming a third word line WL2 and sixth word line WL5 through the contact plugs 16, and first and second vias 17 and 18. The contacts to the third metal line 23 are placed in defined regions, for example, first contact region 31 and second contact region 32. The word lines coupling to the gate lines 20 disposed between the third word line WL2 and the sixth word line WL5 are disposed between them to maximize the spacing between the first and the second metal lines 21 and 22. For example, the fourth word line WL3 in the first metal line 21, and the fifth word line WL4 in the second metal line 22 are disposed above each other, and located between third word line WL2 and sixth word line WL5. Hence, the effective pitch of the first metal lines 21 ($EP_{21}$) and the second metal lines 22 ($EP_{22}$) in the region between the first and the second contact regions 31 and 32 is lower than the pitch of the first metal lines 21 ($P_{21}$) and the second metal lines 22 ($P_{22}$) i.e. $EP_{21} < P_{21}$, and $EP_{22} < P_{22}$. This reduction in the required effective pitch results in the loss in design efficiency relative to the ideal case. Hence, as illustrated in this embodiment (e.g., see FIG. 2c), three metal lines can be routed in the space normally available for only two metal lines. This reduces the cell height by 33% or alternately increases the minimum metal pitch by 50%.

Figure 2D:
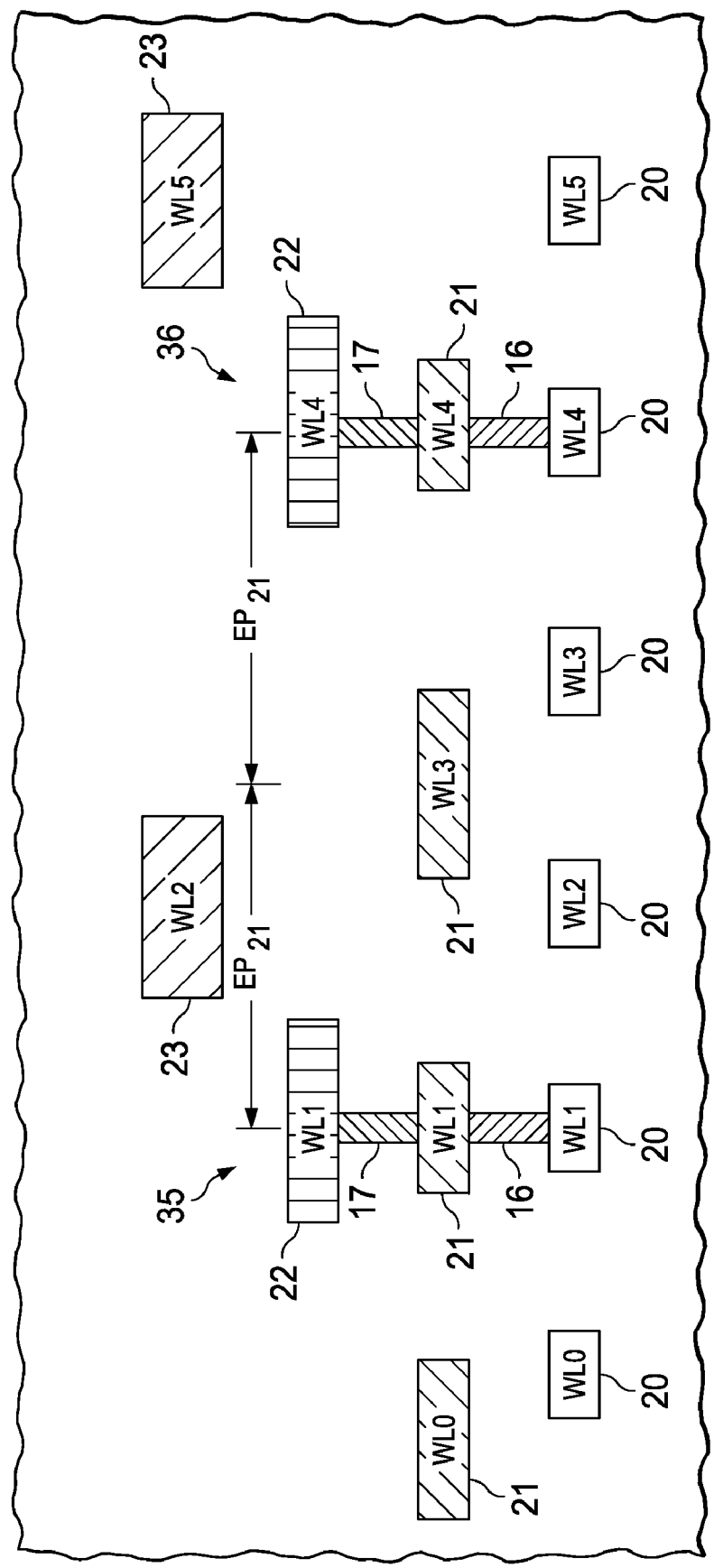
Figure 2E:
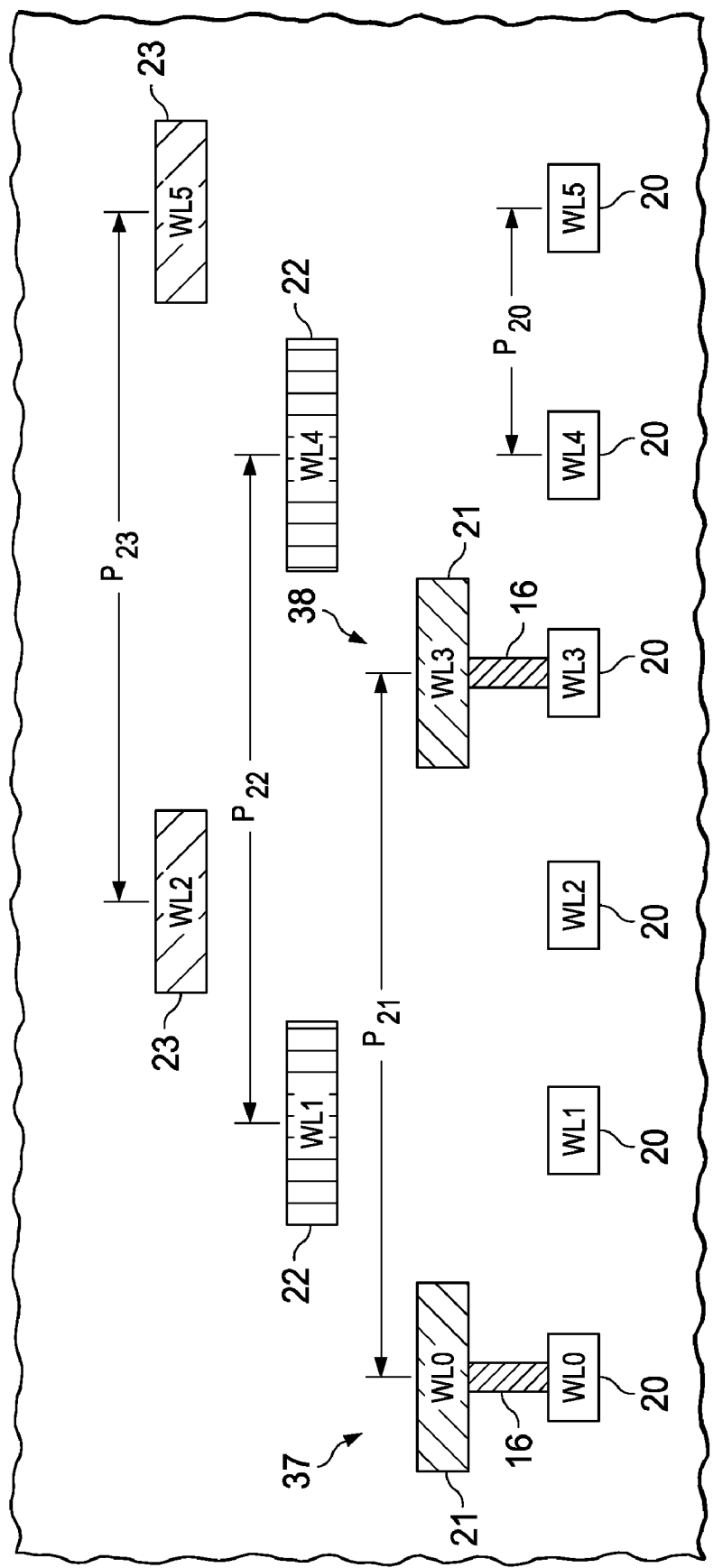

Similarly, FIG. 2d illustrates forming a second word line WL1 and a fifth word line WL4 through the contact plugs 16, and first vias 17. The corresponding contact regions of the second word line WL1 and the fifth word line WL4 are illustrated in FIG. 2d forming the third and fourth contact regions 35 and 36. The first metal lines 21 forming the fourth word line WL3 are formed equidistant from the first metal lines 21 forming the second word line WL1 and the fifth word line WL4. Thus the effective pitch of the first metal lines $EP_{21}$ is lower than the pitch of the first metal lines $P_{21}$ in the rest of the layout. However, the significant gain in minimum metal pitch achieved from the multiple stacking of the word line stitching is sufficient to offset some loss due to such restrictions. FIG. 2e illustrates the connection of a first word line WL0 and a fourth word line WL3 through the contact plugs 16 in the contact regions 37 and 38.

Figure 3A:
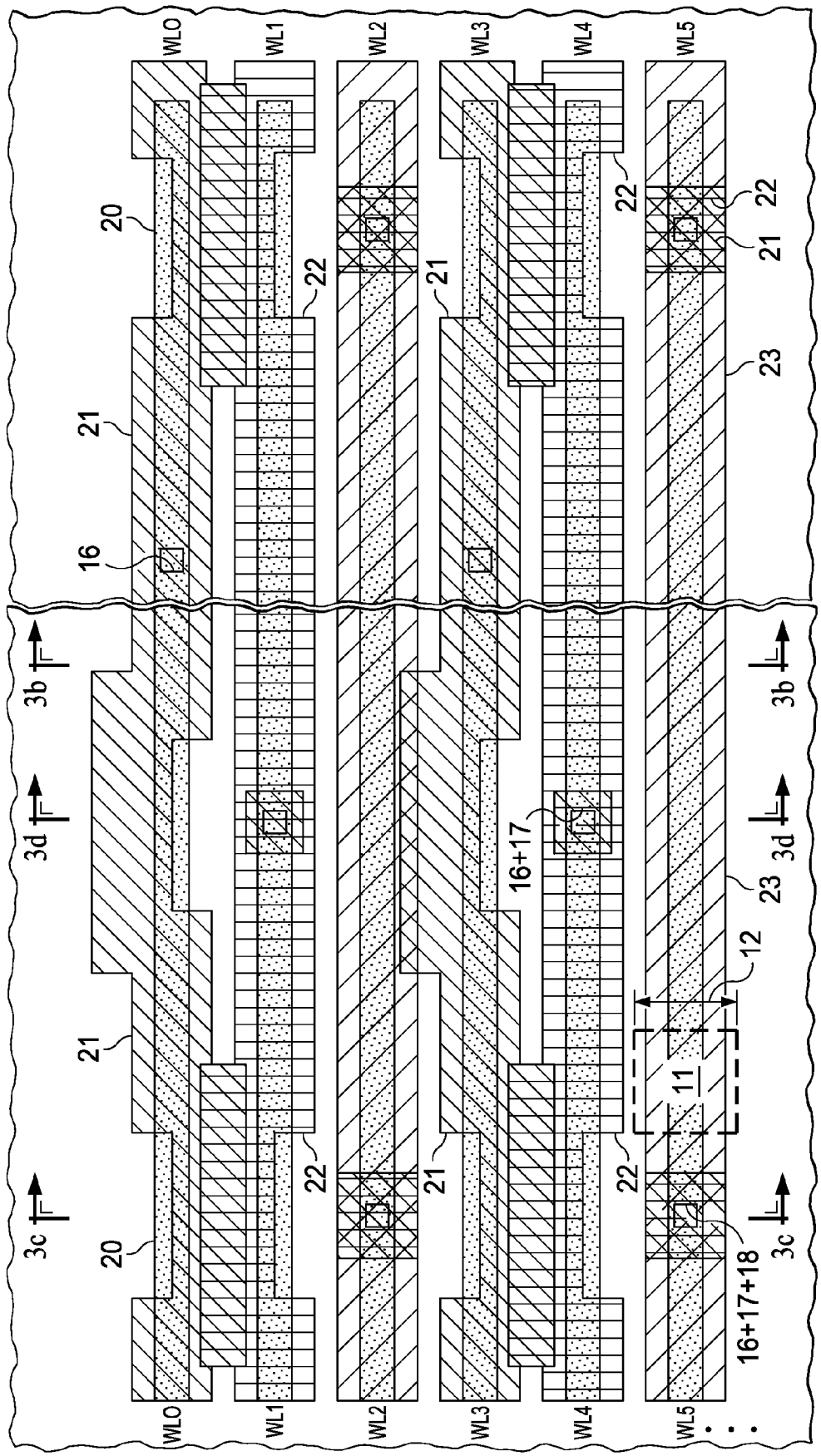
Figure 3B:
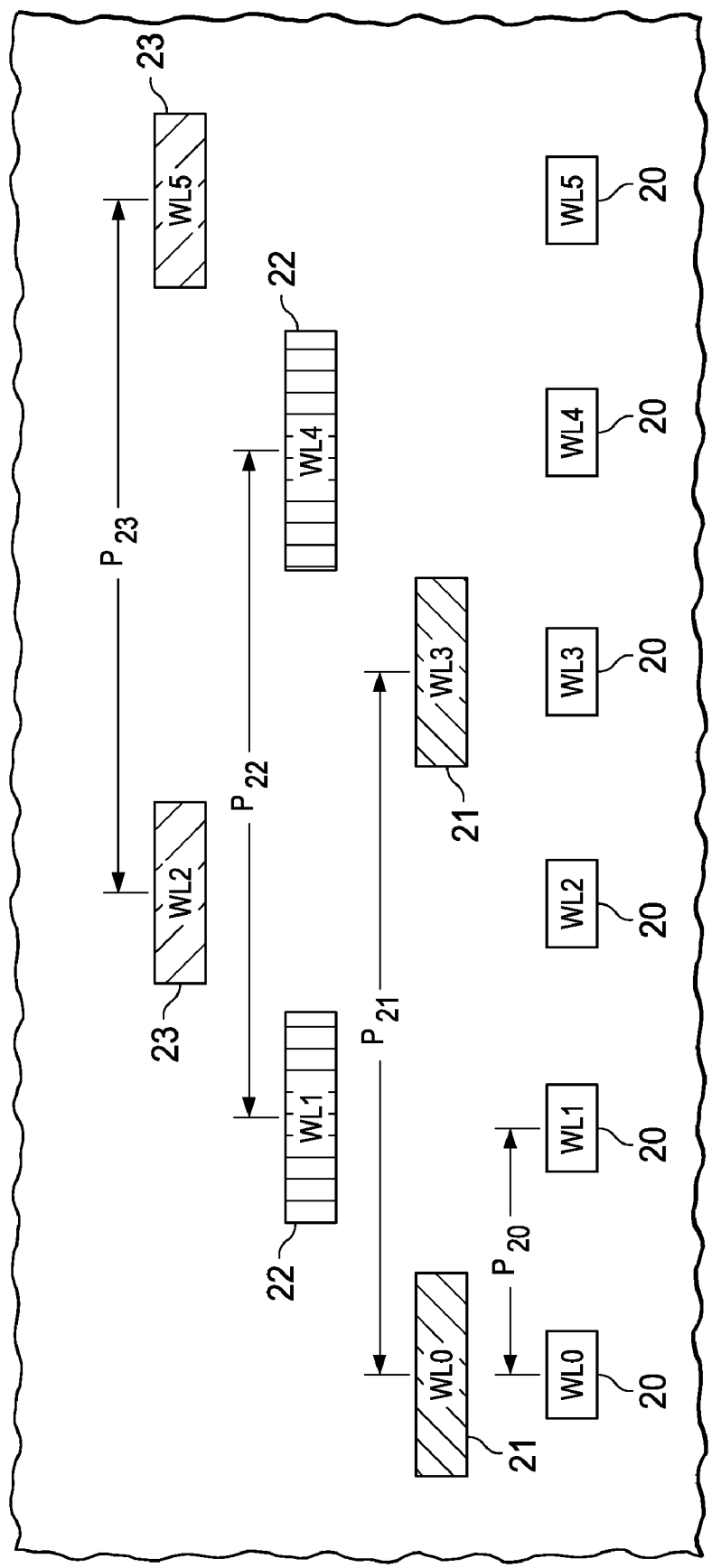
Figure 3C:
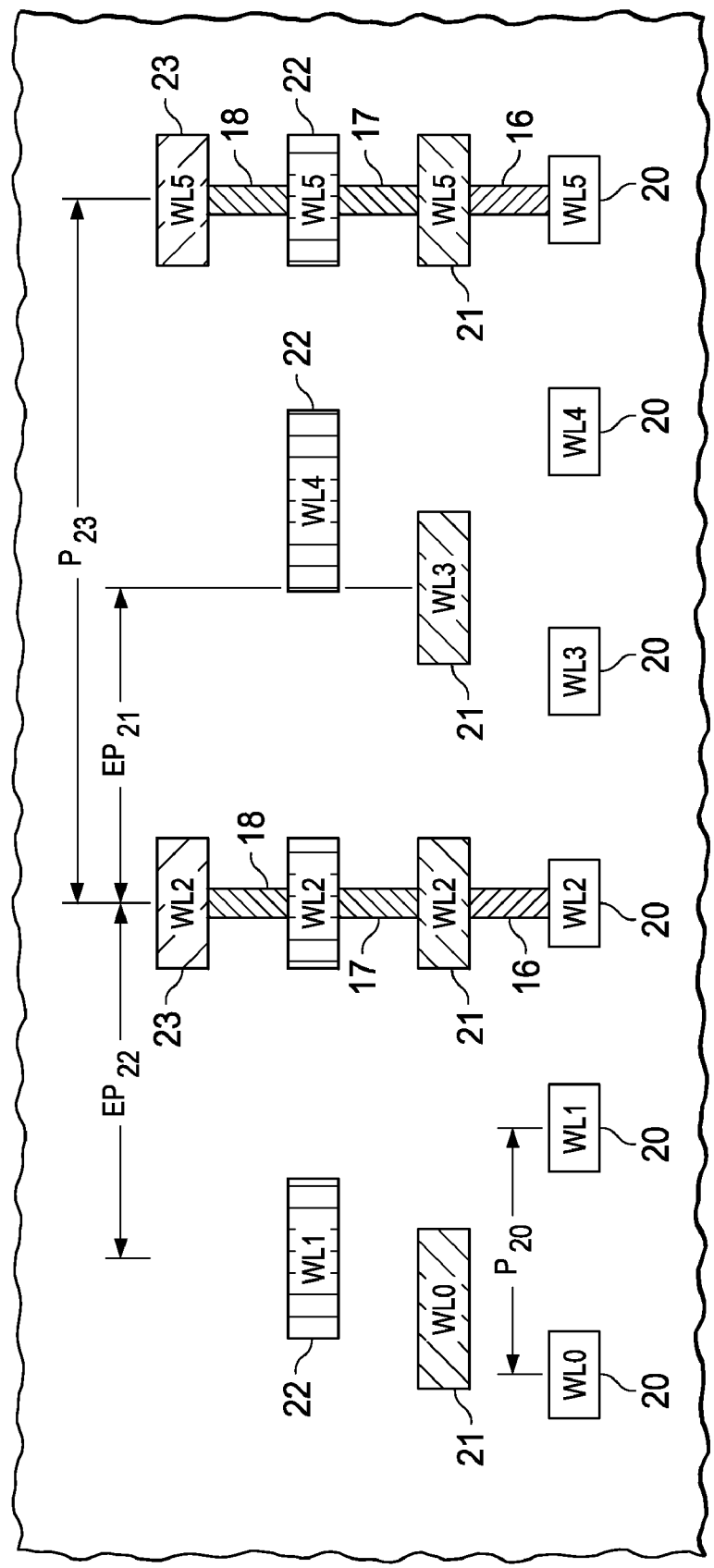
Figure 3D:
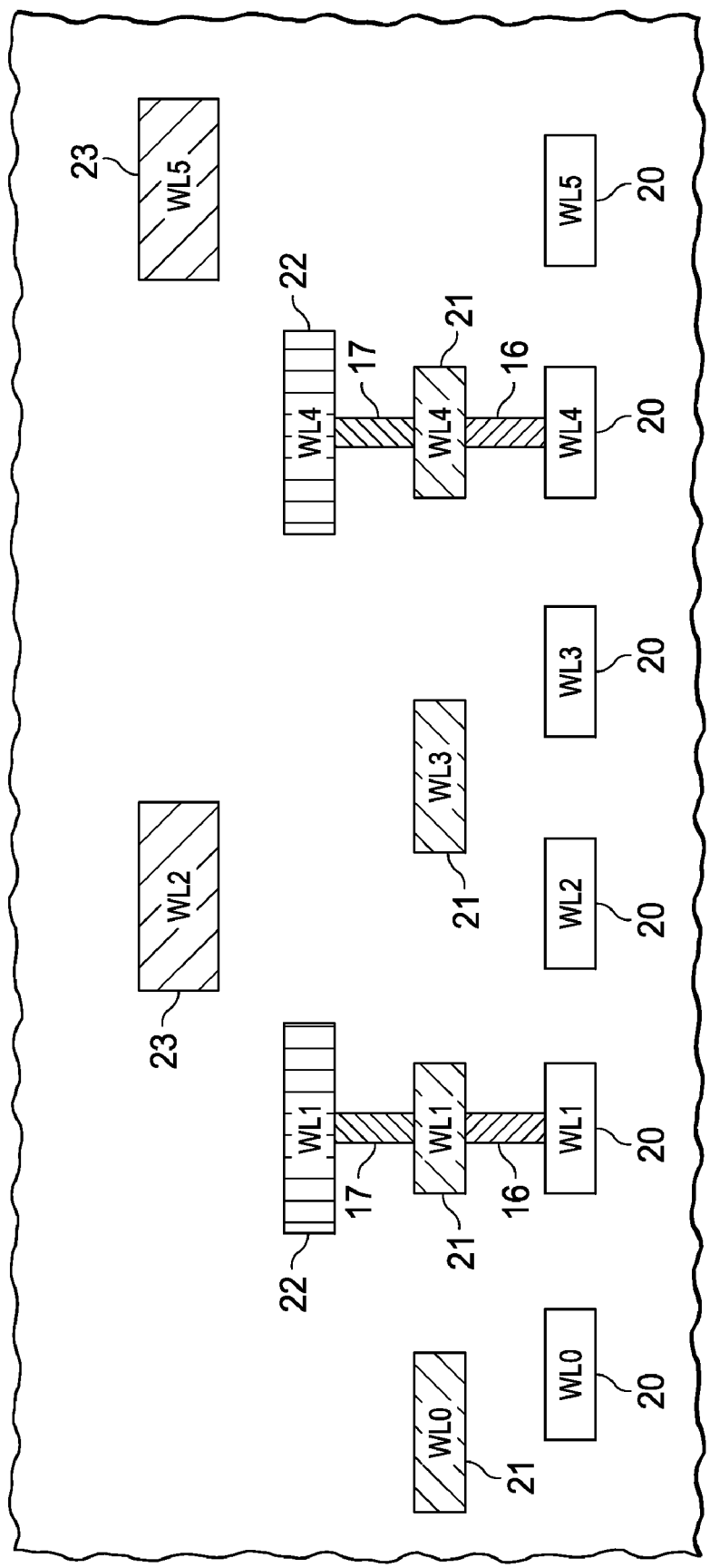

FIG. 3, which includes FIGS. 3a-3d, illustrates a layout of a memory cell array in an embodiment of the invention. FIG. 3a illustrates the top view and illustrates all the layers overlaid together, whereas FIGS. 3b-3d illustrate corresponding vertical cross sectional views. A larger portion of the layout is shown in this embodiment to provide a clearer illustration.

In this embodiment, unlike the prior embodiment, the first metal lines 21 and the second metal lines 22 are not formed equidistantly around the contact regions; e.g., first and second contact regions 31 and 32. Hence, the design in this case is less efficient than the embodiment illustrated in FIG. 2. In the cell array region as illustrated in the cross sectional view, this embodiment looks similar (FIG. 3b). However, in the contact regions, the first metal lines 21 and the second metal lines 22 are not translated by the maximum available distance to avoid complete overlap between them. This is illustrated clearly in FIGS. 3c and 3d. For example, in FIG. 3c, the fourth word line WL3 and the fifth word line WL4 are not above each other (unlike FIG. 2c). Similarly, as illustrated in FIG. 3d, fourth word line WL3 is not formed equidistant from the third and fourth contact regions 35 and 36.

FIG. 4, which includes FIGS. 4a-4d, illustrates each individual layer of the overlaid structure as illustrated in FIG. 3a, in accordance with embodiments of the invention. Although described in FIG. 3a as semiconductor memory array, the layers in FIG. 4 could also represent mask layers of a mask set used in the fabrication of the memory array.

Figure 4A:
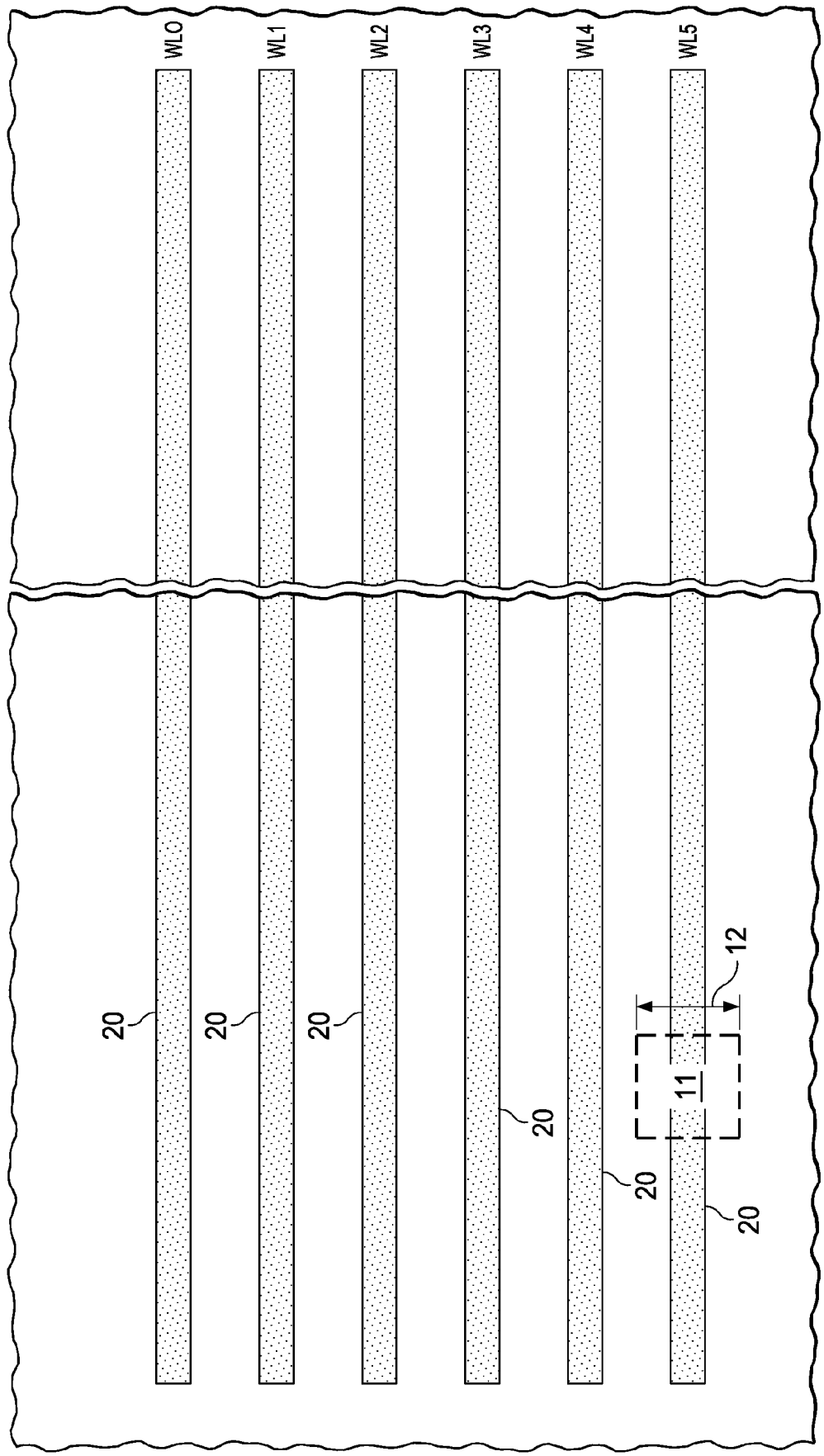
FIGS. 4a-4d, illustrates the layout of FIG. 3, illustrating each level separately.
Figure 4B:
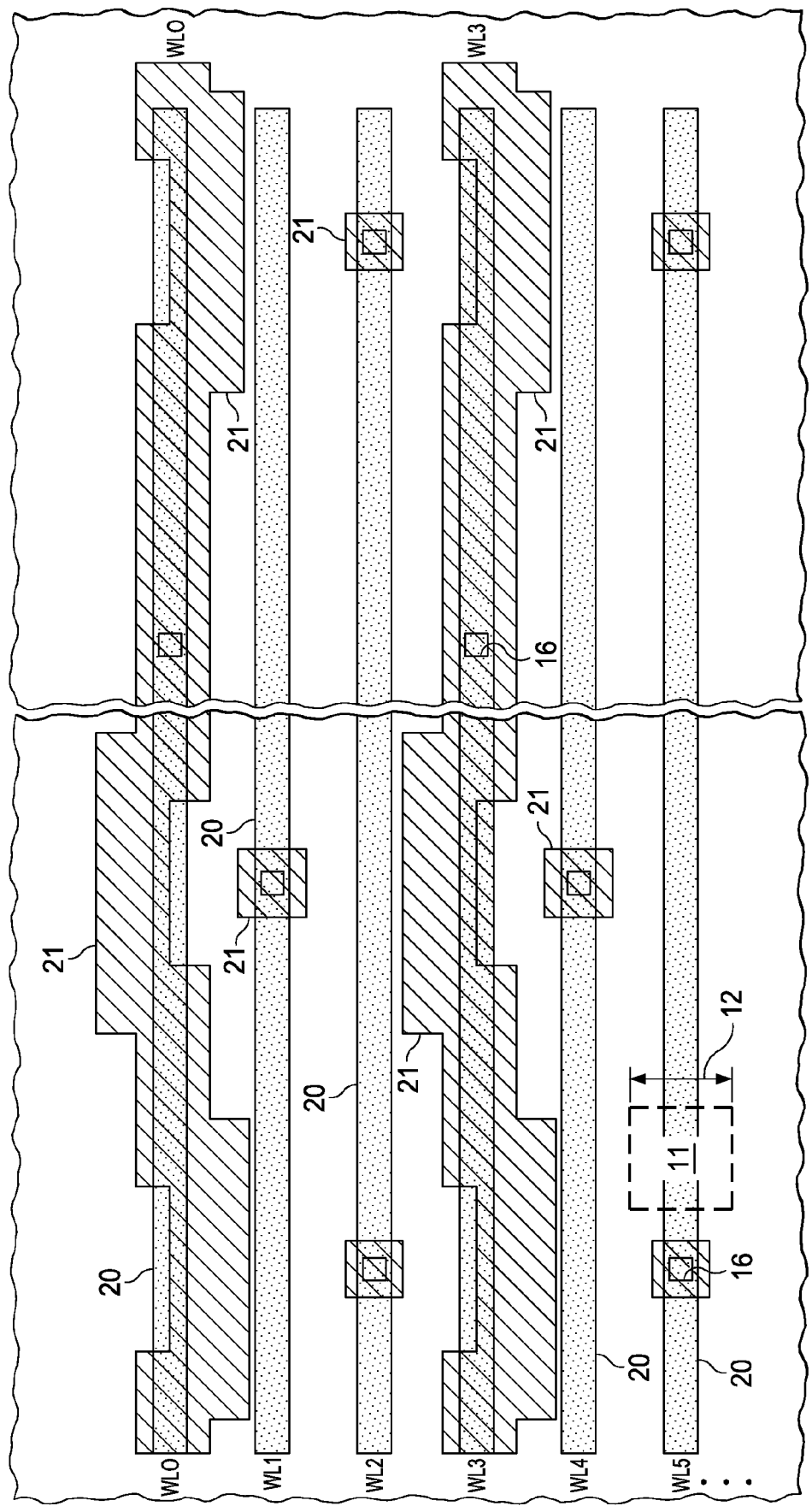
Figure 4C:
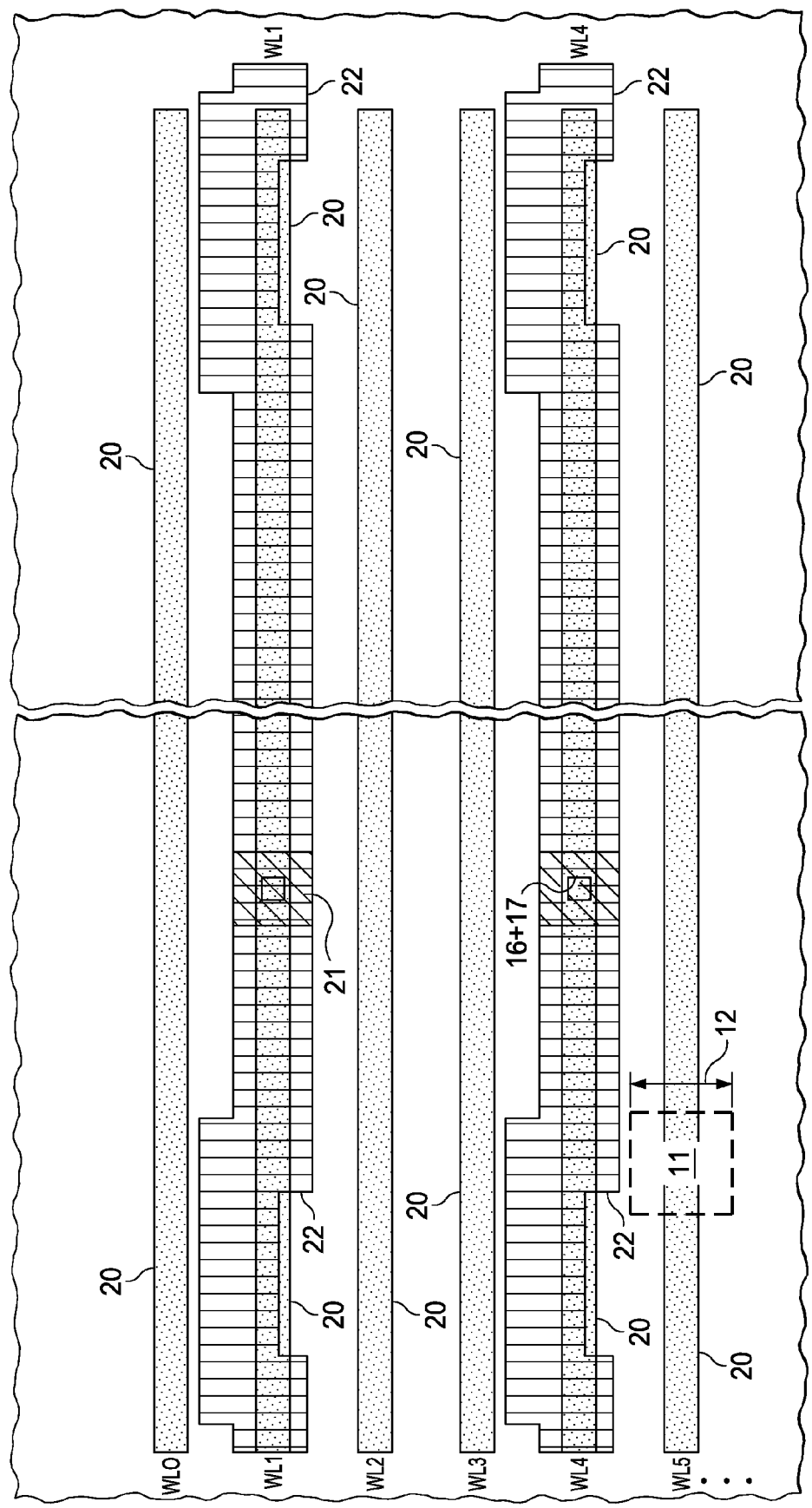
Figure 4D:
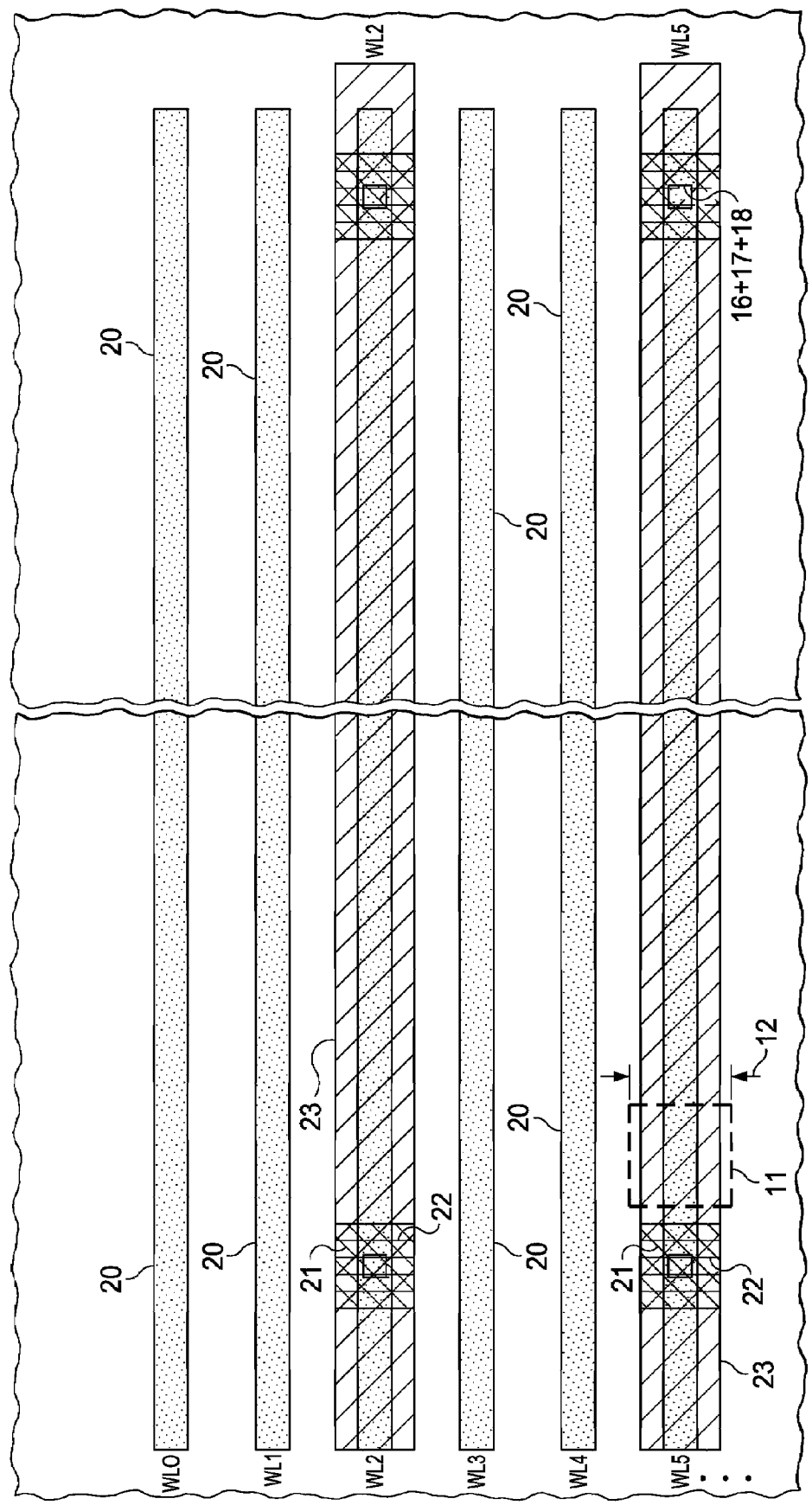

The first layer illustrating a first mask (mask 0) (FIG. 4a) illustrate the mask for patterning the poly silicon gate lines 20. FIGS. 4b-4d also illustrate the gate lines 20 of the mask 0 (FIG. 4a) to show the overlay clearly with respect to the mask 0. FIG. 4b shows the word lines formed in the first metal lines 21 of the memory array. First word line WL0 and fourth word line WL3 are formed in the first metal lines 21 and couple to the gate lines 20 through contact plugs 16. As illustrated in FIG. 4c, the second word line WL1 and the fifth word line WL4 are formed in the second metal lines 22 and couple to the gate lines 20 through contact plugs 16 and first vias 17. Similarly, as illustrated in FIG. 4d, the third word line WL2 and the sixth word line WL5 are formed in the third metal lines 23 and couple to the gate lines 20 through contact plugs 16, first vias 17 and second vias 18.

Figure 5:
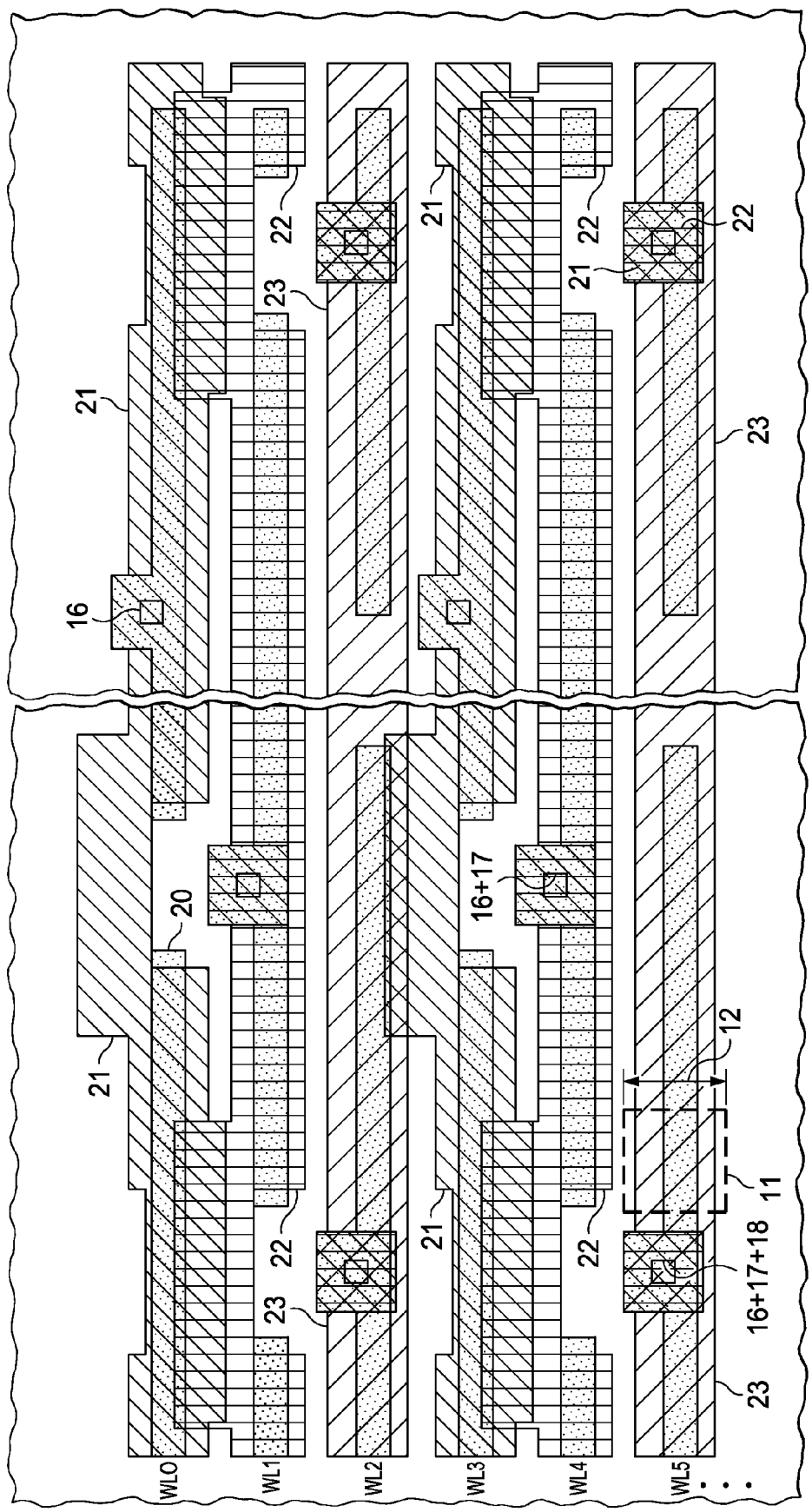
FIG. 5 illustrates a memory cell array using word line stitching with discontinuous gate lines in accordance with an embodiment of the invention.

FIG. 5 illustrates an embodiment of the memory cell array wherein the poly silicon lines are not continuous. Unlike the embodiment described in FIGS. 2 and 3, in this embodiment, the gate lines 20 are not continuous. The interruptions in the gate lines 20 allow increased room for placing contacts in an adjacent word line. In such embodiments, care is taken to contact the stitching metal lines to complete the circuit. In particular, at least one contact is necessary before an interruption in gate poly silicon line is allowed.

FIG. 6, which includes FIGS. 6a-6e, illustrates an embodiment of the invention illustrating a different stitching scheme to reduce the cell height of the memory array. In the embodiment illustrated in FIG. 6, three metal pitches are used to stitch four poly silicon gate lines (for example, WL0-WL3). The four poly silicon gate lines are stitched with metal lines in first, second and third metal levels. Within such a block three metal pitches, two for the metal lines themselves and one for the space to contact downwards through the vias are needed.

Figure 6A:
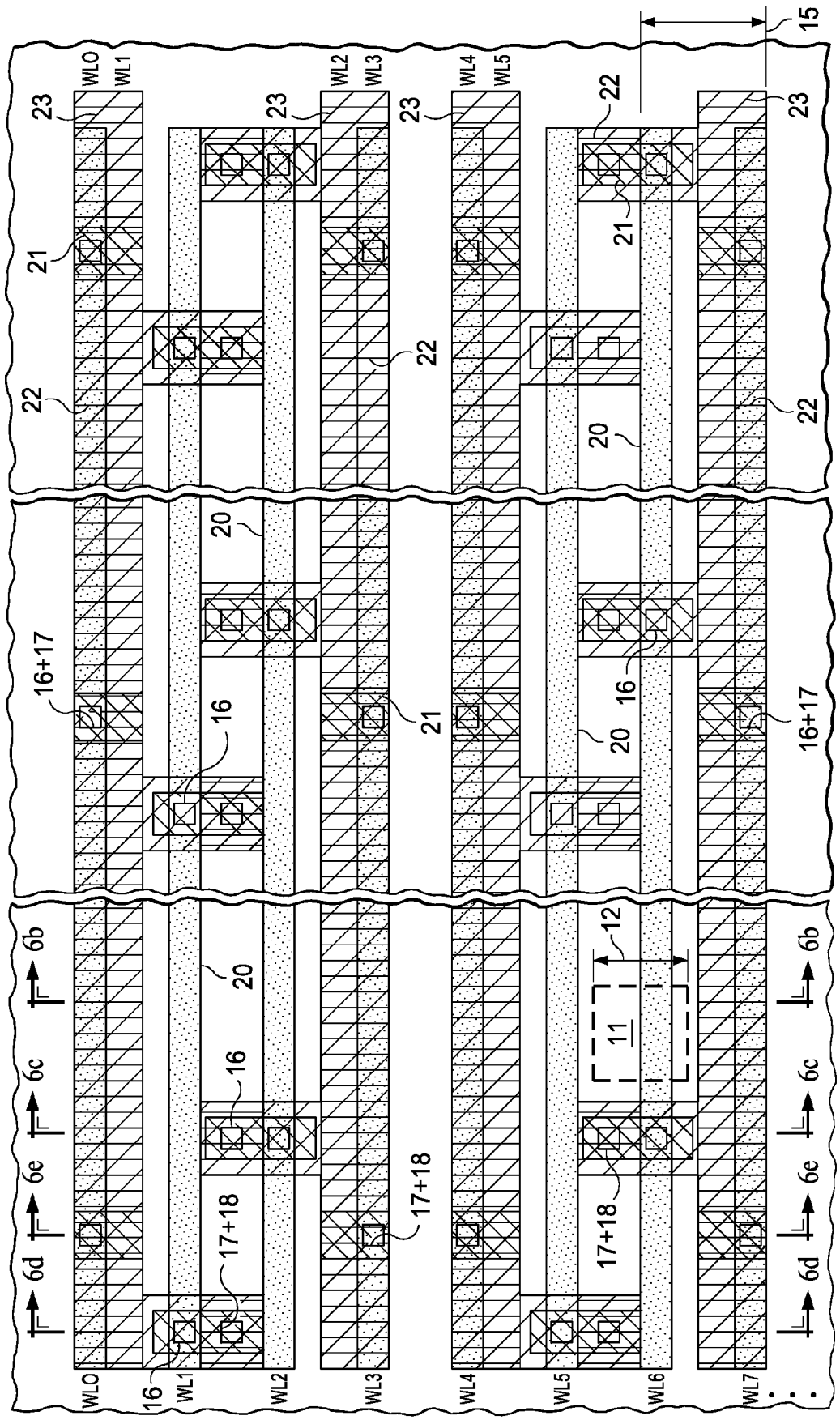
Figure 6B:
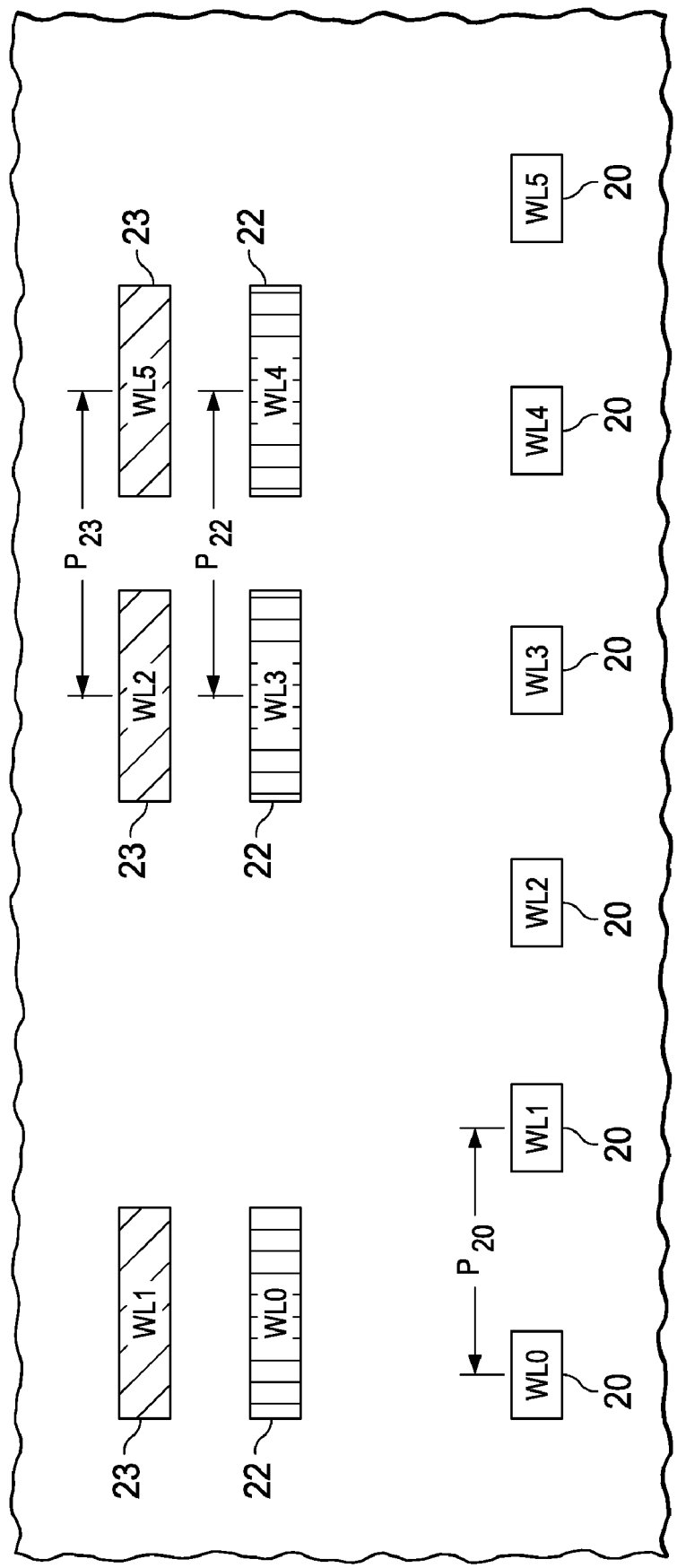

FIG. 6a illustrates a top view and FIGS. 6b-6e illustrate cross sectional views. Further, for clarity only the first six poly gate lines are illustrated in the cross sectional views of FIGS. 6b-6e. Referring to FIG. 6a and the cross sectional view of FIG. 6b, the word line stitching portion of the first word line WL0 and the second word line WL1 are disposed in vertically adjacent metal lines. Third metal lines 23 comprise the word line stitching portions of a second word line WL1, a third word line WL2, and a sixth word line WL5. The third metal lines 22 are coupled to gate lines 20 comprising the second word line WL1, the third word line WL2, and the sixth word line WL5. Second metal lines 22 comprise the word line stitching portions of a first word line WL0, a fourth word line WL3, and a fifth word line WL4. The first metal lines 21 are formed locally and couple to the second metal lines 22 and the third metal lines 23. FIG. 6a further illustrates a seventh, and an eighth word line WL6 and WL7 that are not illustrated in the cross sectional views of FIGS. 6b-6e.

Figure 6C:
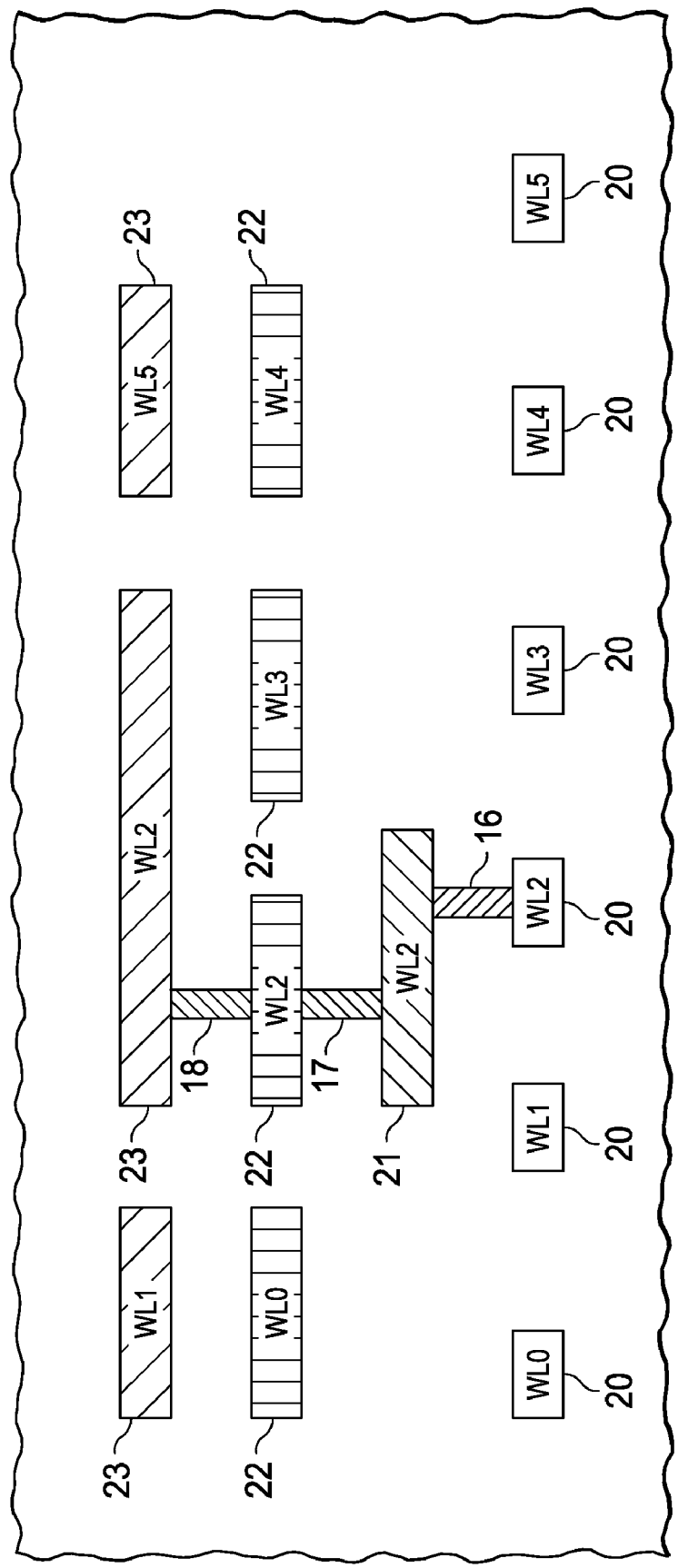
Figure 6D:
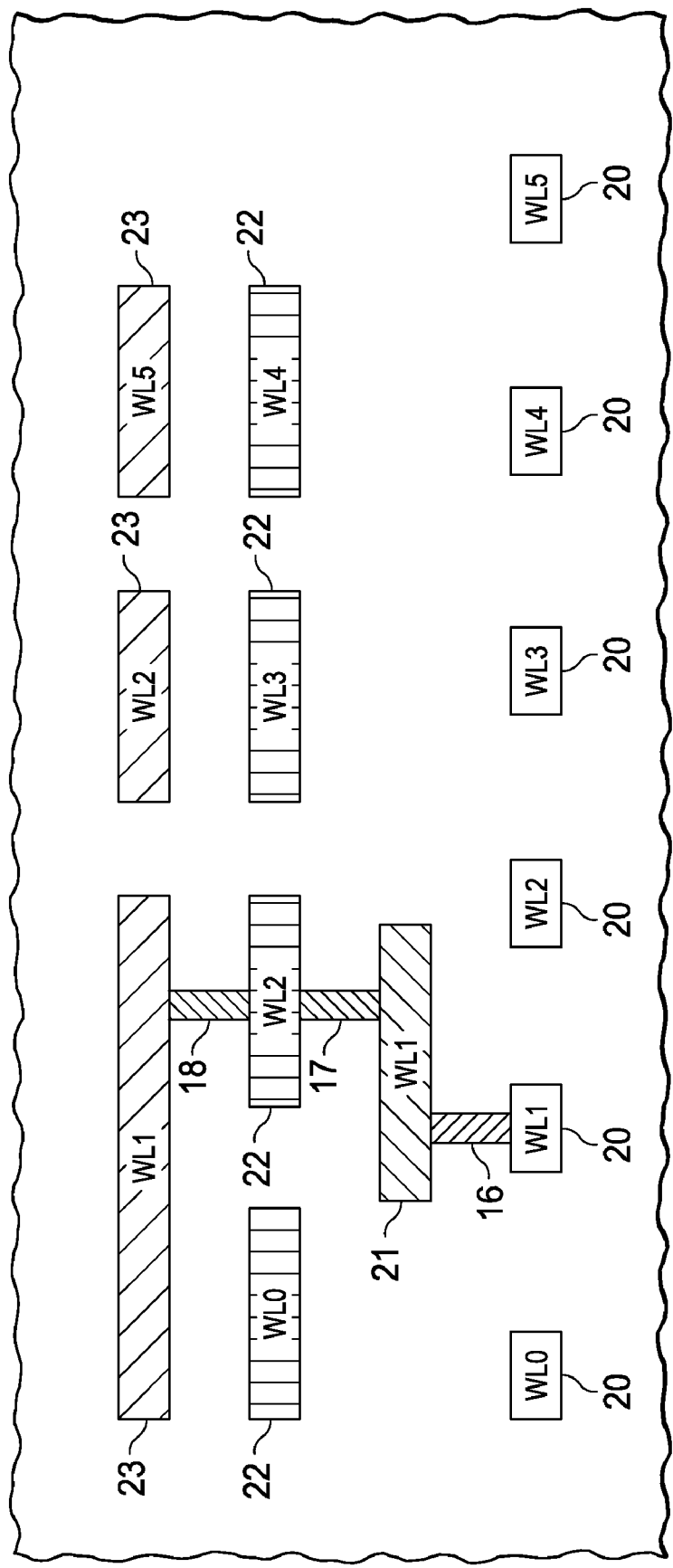
Figure 6E:
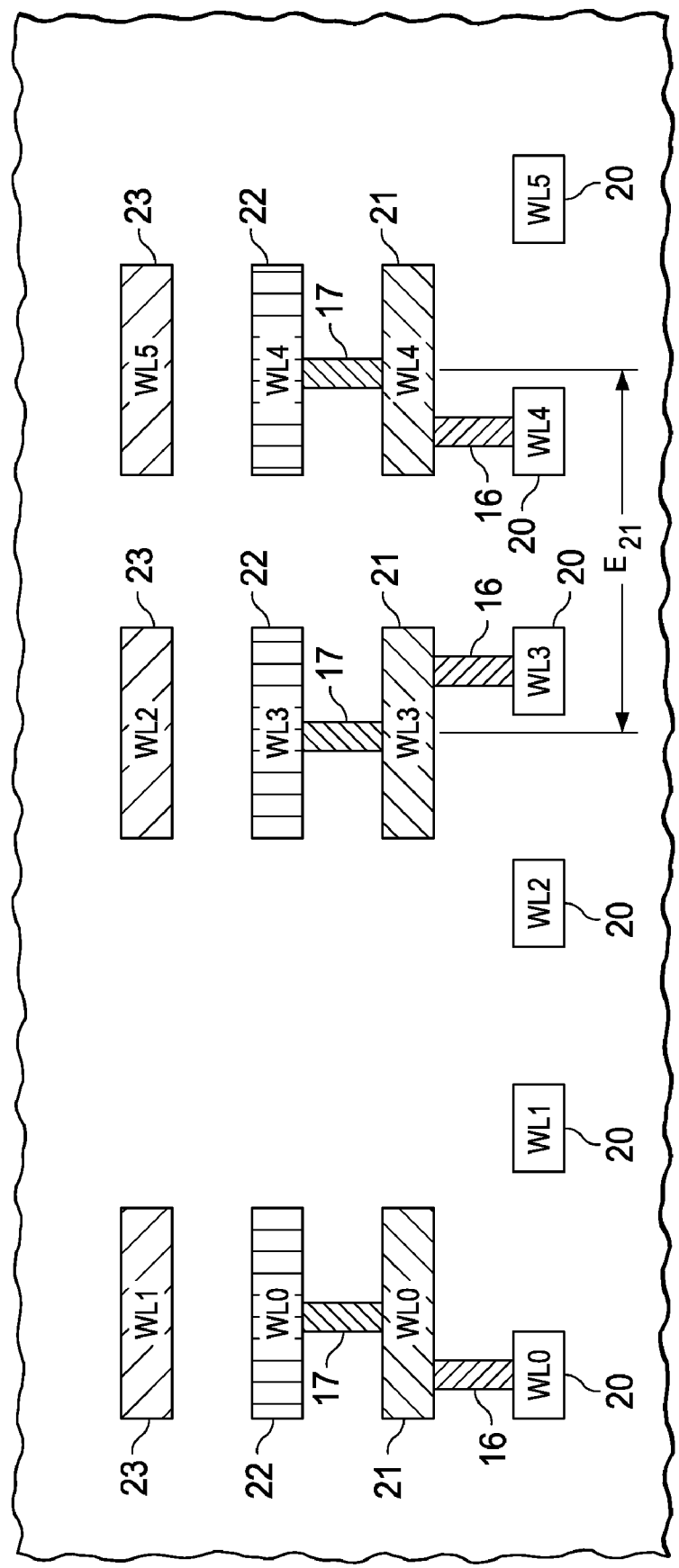

As illustrated in FIG. 6c, in a contact forming region, the third word line WL2 from the third metal lines 23 is coupled through the second metal lines 22 and the first metal lines 21. However, the second metal lines 22 of the third word line WL2 are disposed equidistant from adjacent word lines, for example, the second metal lines 22 of the third word line WL2 is disposed equidistant from a second neighbor word line (the first word line WL0) and a first neighbor word line (the fourth word line WL3). The first metal lines 21 of the third word line WL2 are disposed equidistant from adjacent fourth neighbor word lines. For example, first metal lines 21 of the third word line WL2 are disposed periodically after three word lines. Hence, the next first metal line 21 is coupled to seventh word line WL6. Similarly, FIG. 6d illustrates stitching the second word line WL1 through the second metal level. FIG. 6e illustrates a different cross section and describes the coupling of the second metal lines 22 forming portions of first, fourth, and fifth word lines WL0, WL3 and WL4.

Figure 7B:
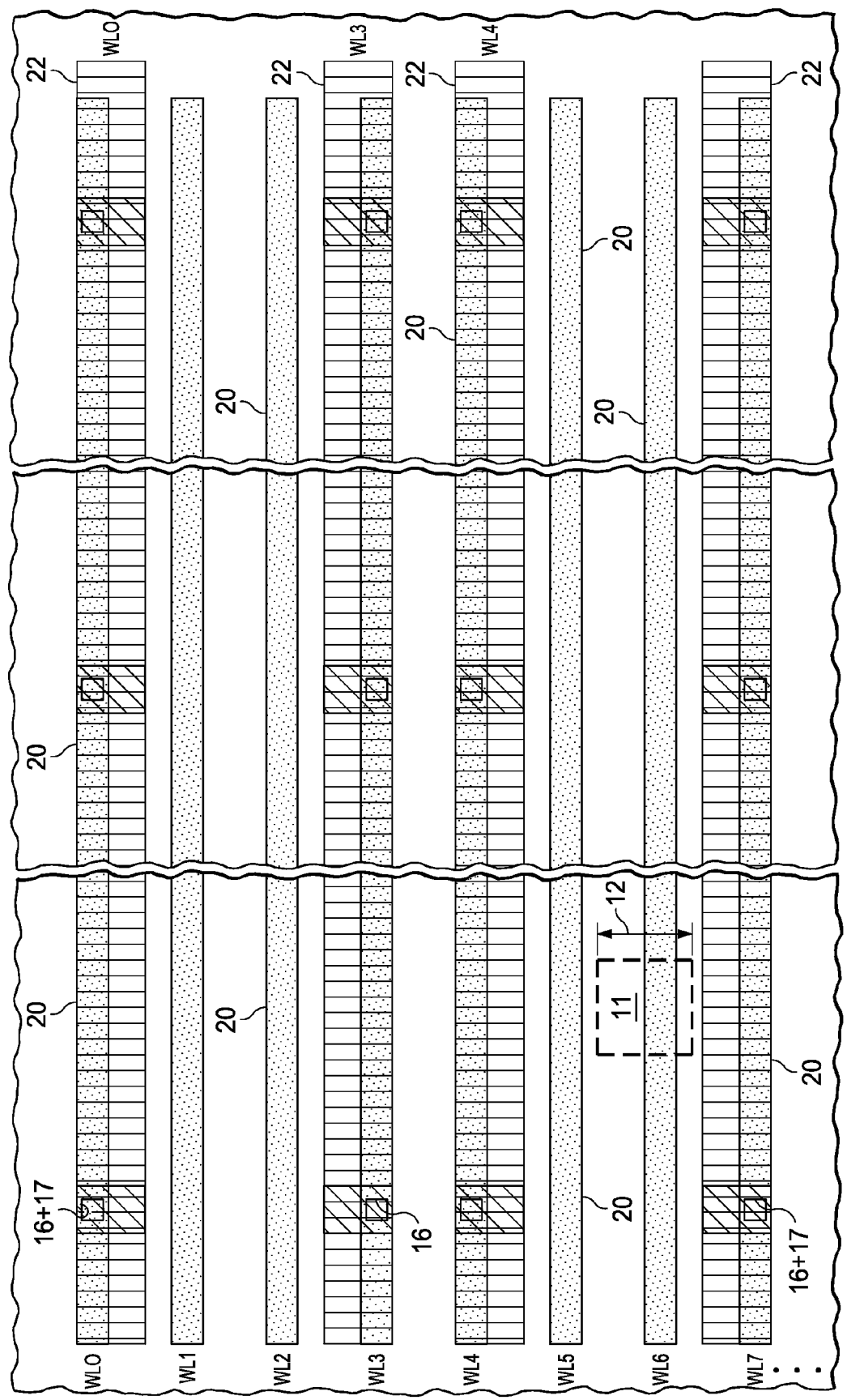
Figure 7C:
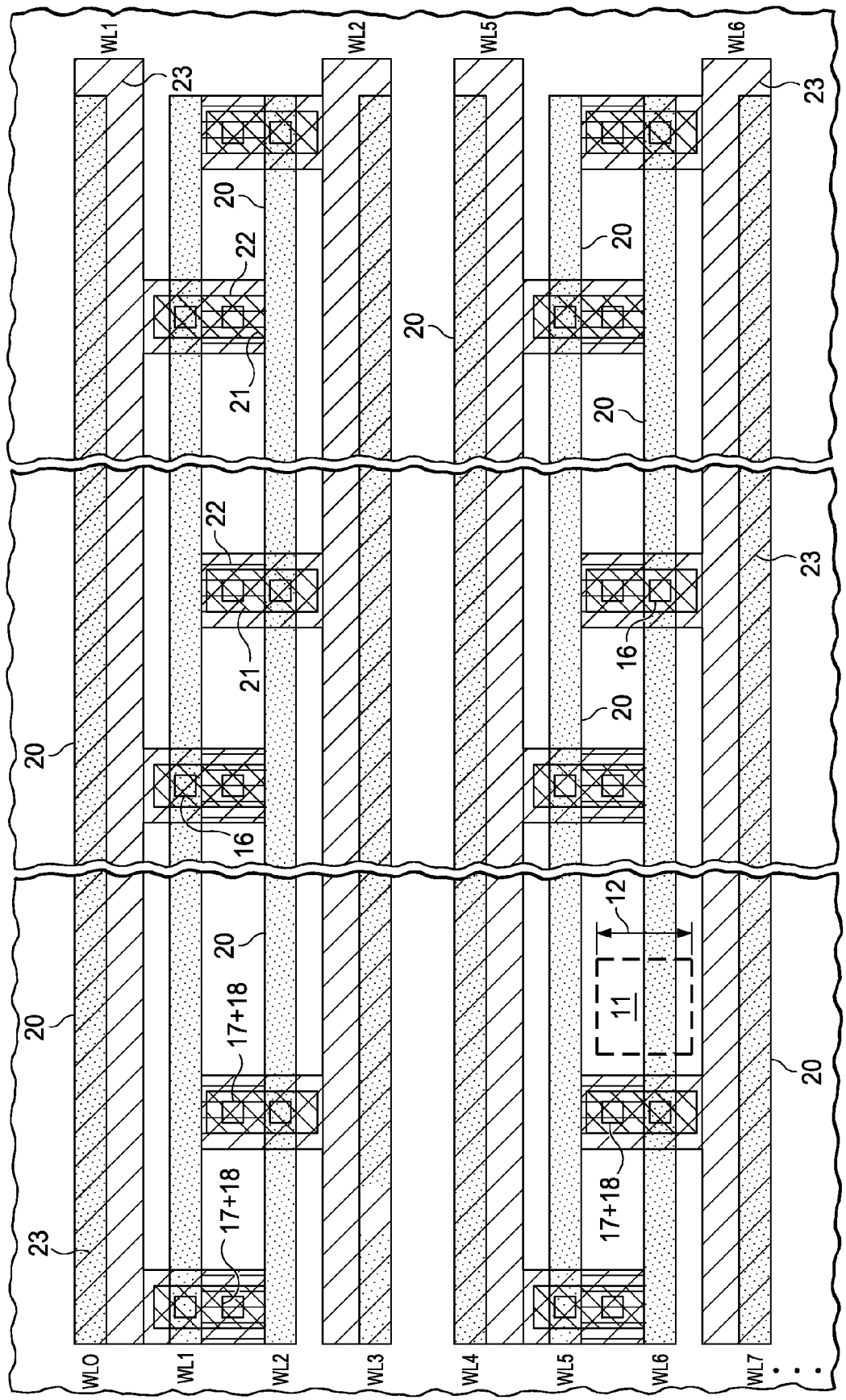

FIG. 7, which includes FIG. 7a-7c, illustrates each metal level of FIG. 6 separately showing the electrical coupling to that particular metal level. FIG. 7a illustrates the first metal level comprising first metal lines 21. The first metal lines are formed locally and couple to underlying gate lines 20 through contact plugs 16. FIG. 7b illustrates the second metal lines forming a first word line WL0, a fourth word line WL3, a fifth word line WL4 and an eighth word line WL7. FIG. 7c illustrates the third metal lines forming a second word line WL1, a third word line WL2, a sixth word line WL5 and a seventh word line WL6.

Figure 8:
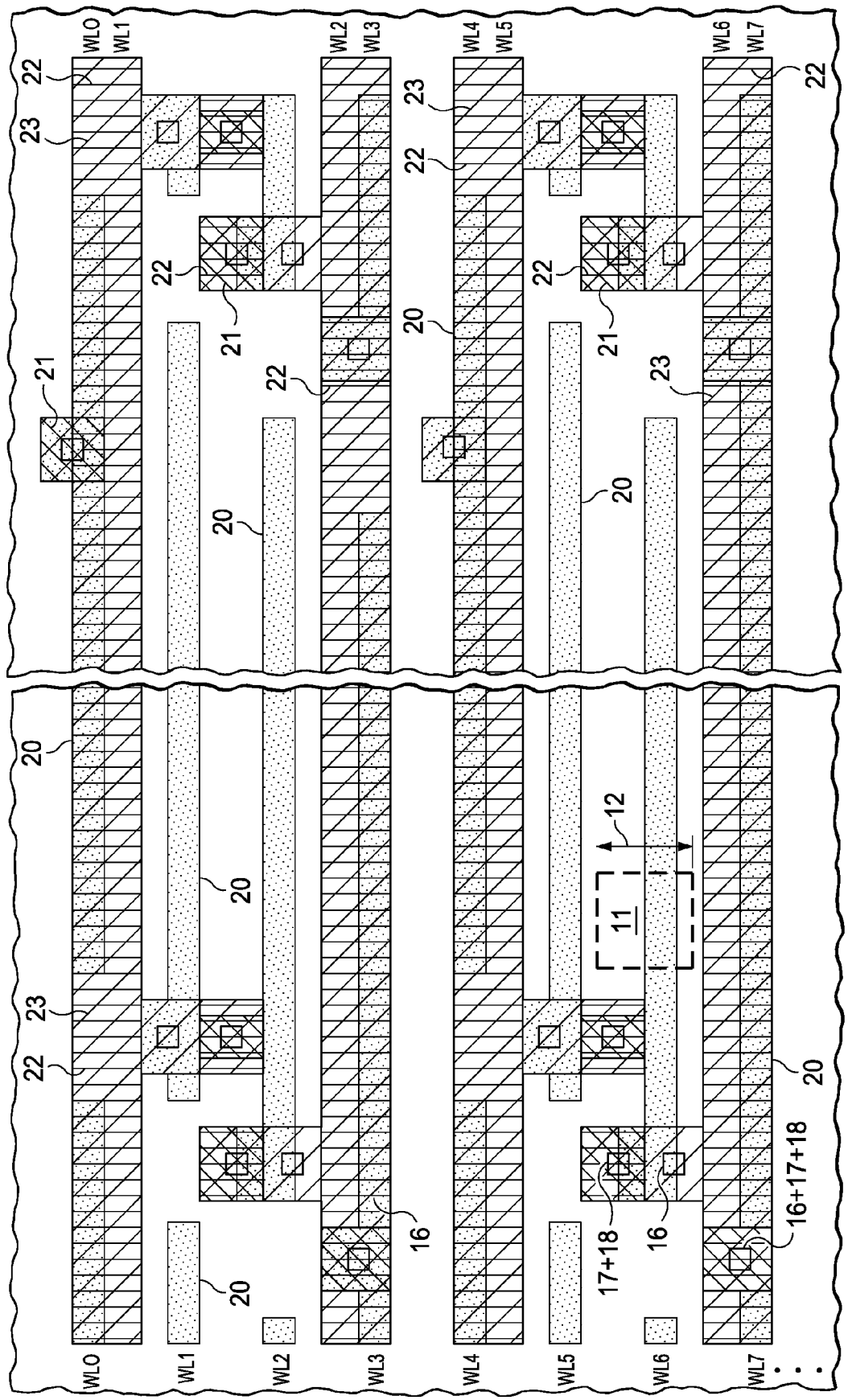
FIG. 8 illustrates a memory cell array using word line stitching with discontinuous gate lines in accordance with an embodiment of the invention.

FIG. 8 illustrates an embodiment of the memory cell array wherein the poly silicon lines are not continuous in a region surrounding a region where contacts are made to the gate lines 20. In this embodiment, the gate lines 20 are not continuous, unlike the embodiment described in FIG. 6. The discontinuities in the gate lines 20 allow increased room for placing contacts in an adjacent word line. In such embodiments, care is taken to contact the stitching metal lines to complete the circuit. In particular, at least one contact is necessary before an interruption in gate poly silicon lines is allowed.

Although embodiments of the invention are illustrated using only three metal levels, various embodiments may use more or less metal levels. FIG. 9, which includes FIGS. 9a-9d, illustrates a four metallization stitching scheme adopting the contact placement scheme of FIG. 2.

Figure 9A:
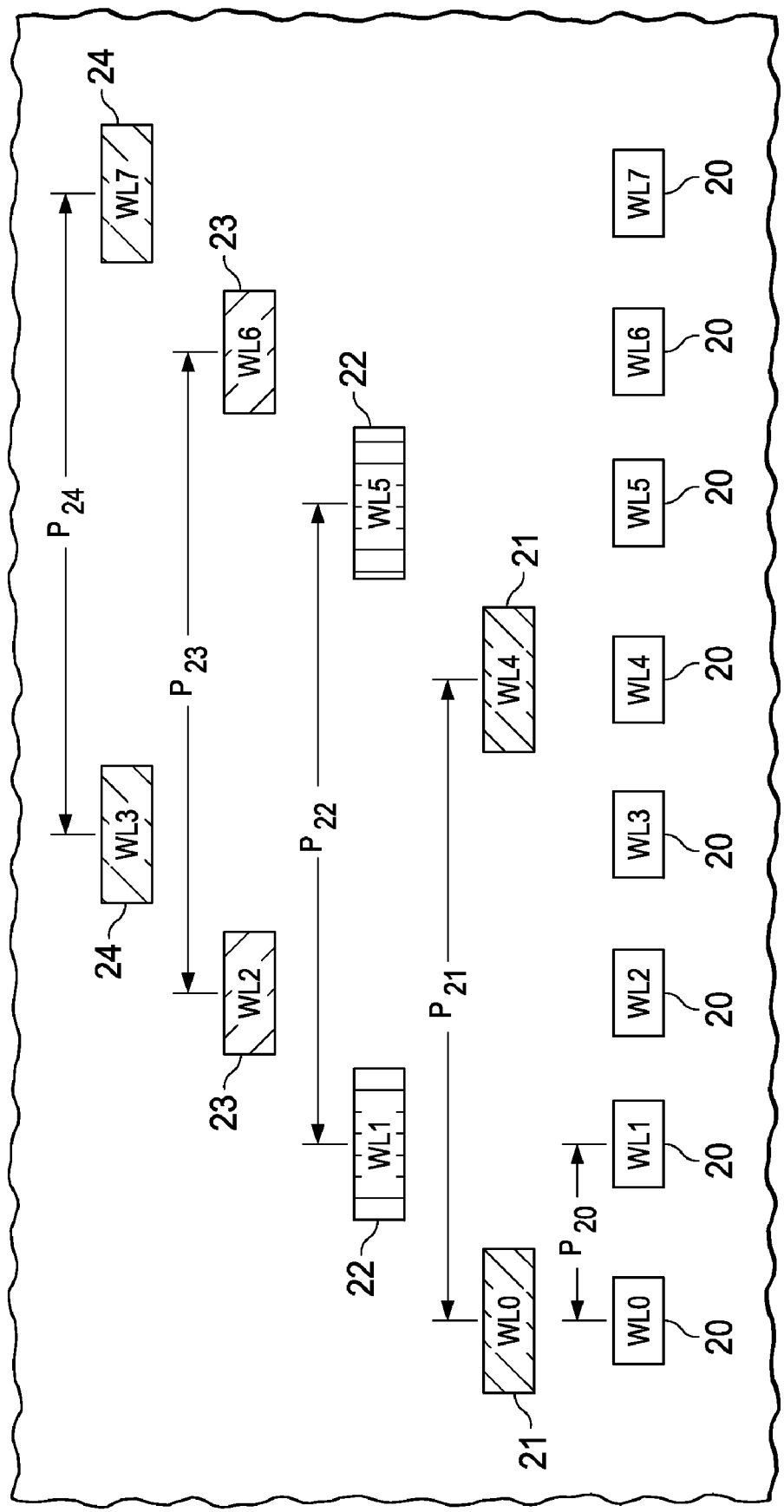
FIGS. 9a-9d, illustrates a memory cell array using word line stitching comprising four metal levels in accordance with an embodiment of the invention.

Referring to FIG. 9a, the first metal lines 21 are formed over the gate lines 20 of the first and fifth word lines WL0 and WL4. The first metal lines 21 are also coupled to the corresponding word lines underneath and form a portion of the first and fifth word lines WL0 and WL4. The second metal lines 22 are disposed above the gate lines 20 of the second and sixth word lines WL1 and WL5. The second metal lines 22 form a portion of the second and sixth word lines WL1 and WL5. Similarly, the third metal lines 23 are disposed above the gate lines 20 of the third and seventh word lines WL2 and WL6. The third metal lines 23 form a portion of the third and seventh word lines WL2 and WL6. The fourth metal lines 24 are disposed above and coupled to the gate lines 20 of the fourth and eight word lines WL3 and WL7.

Figure 9B:
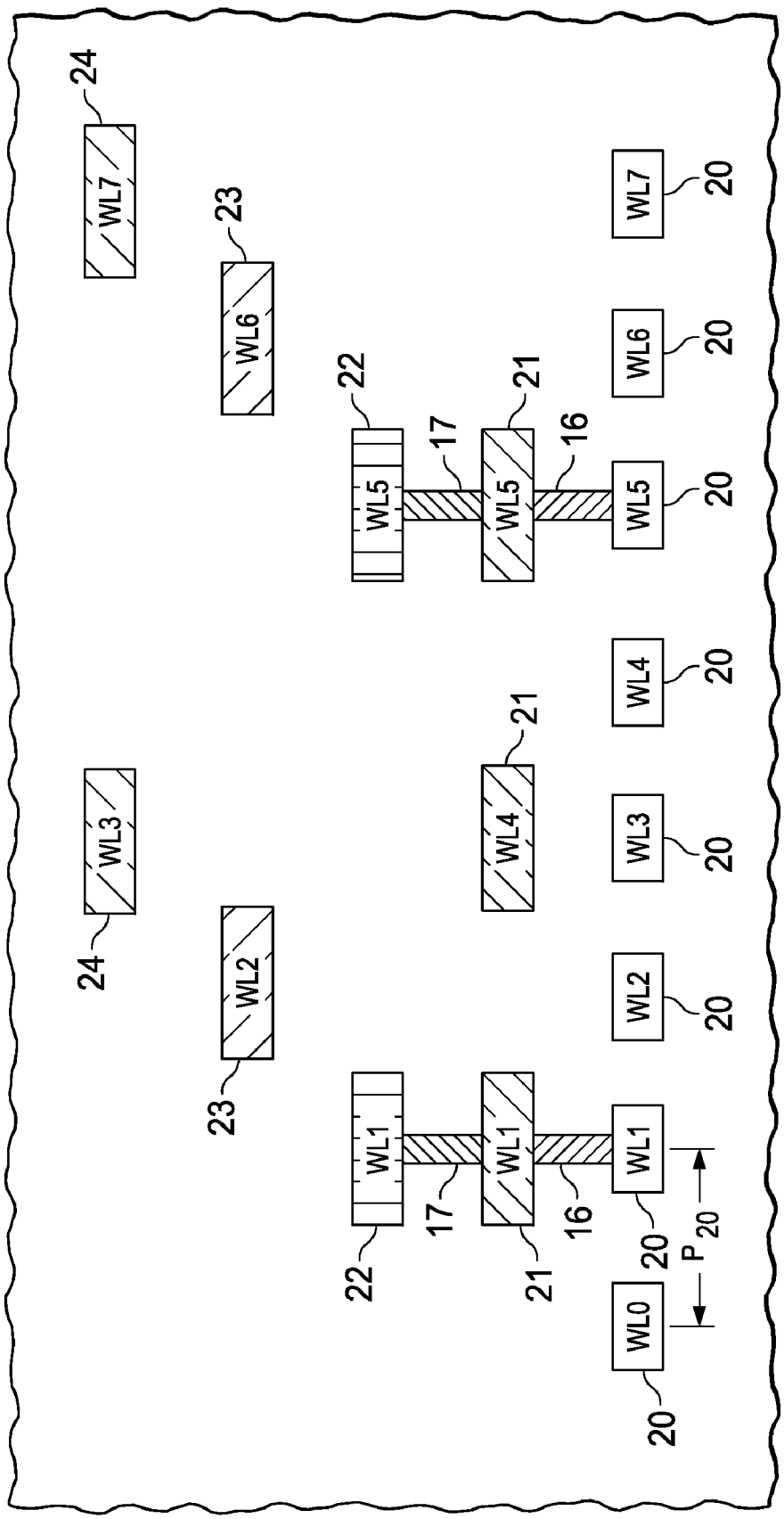
Figure 9C:
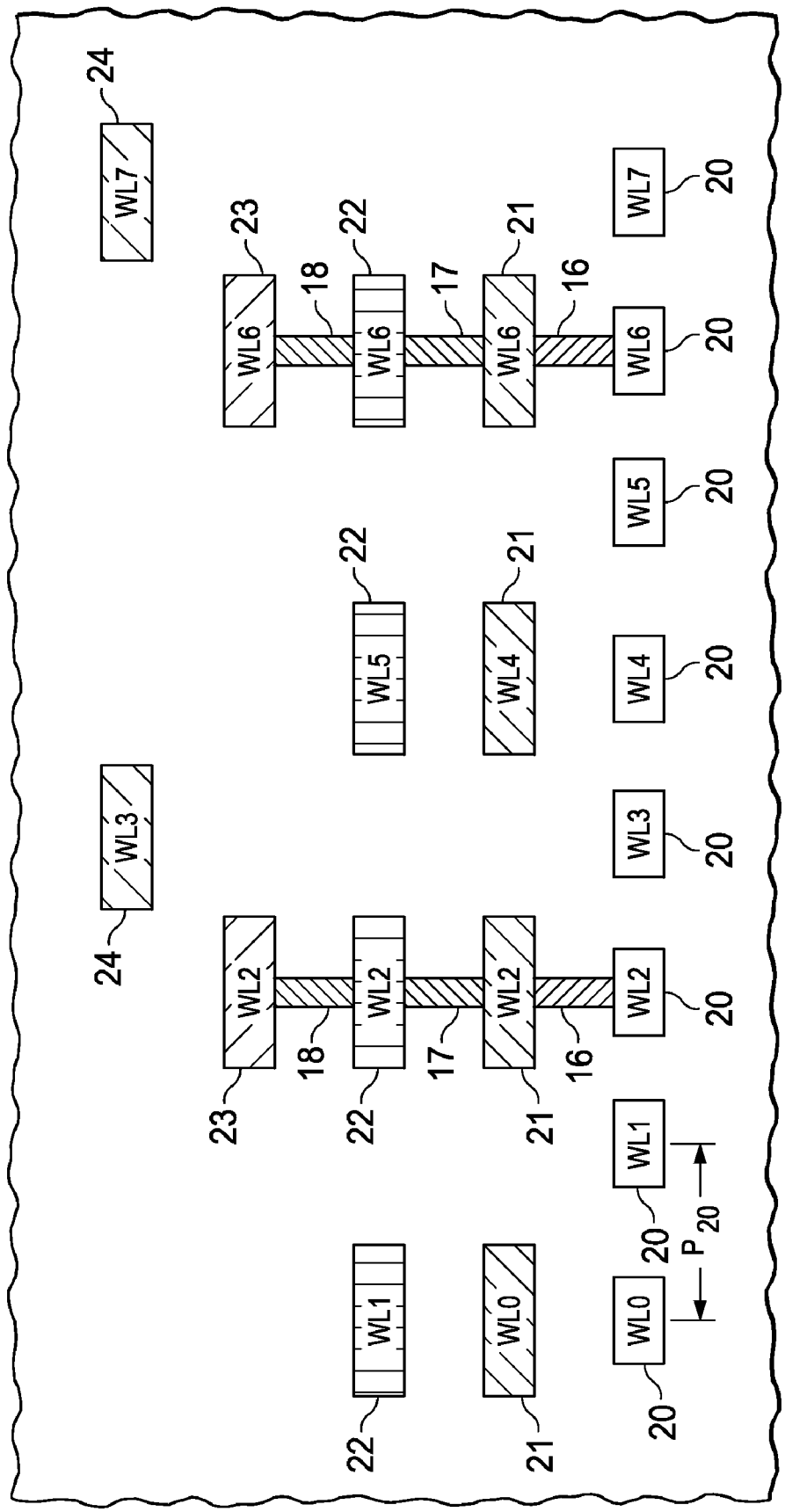
Figure 9D:
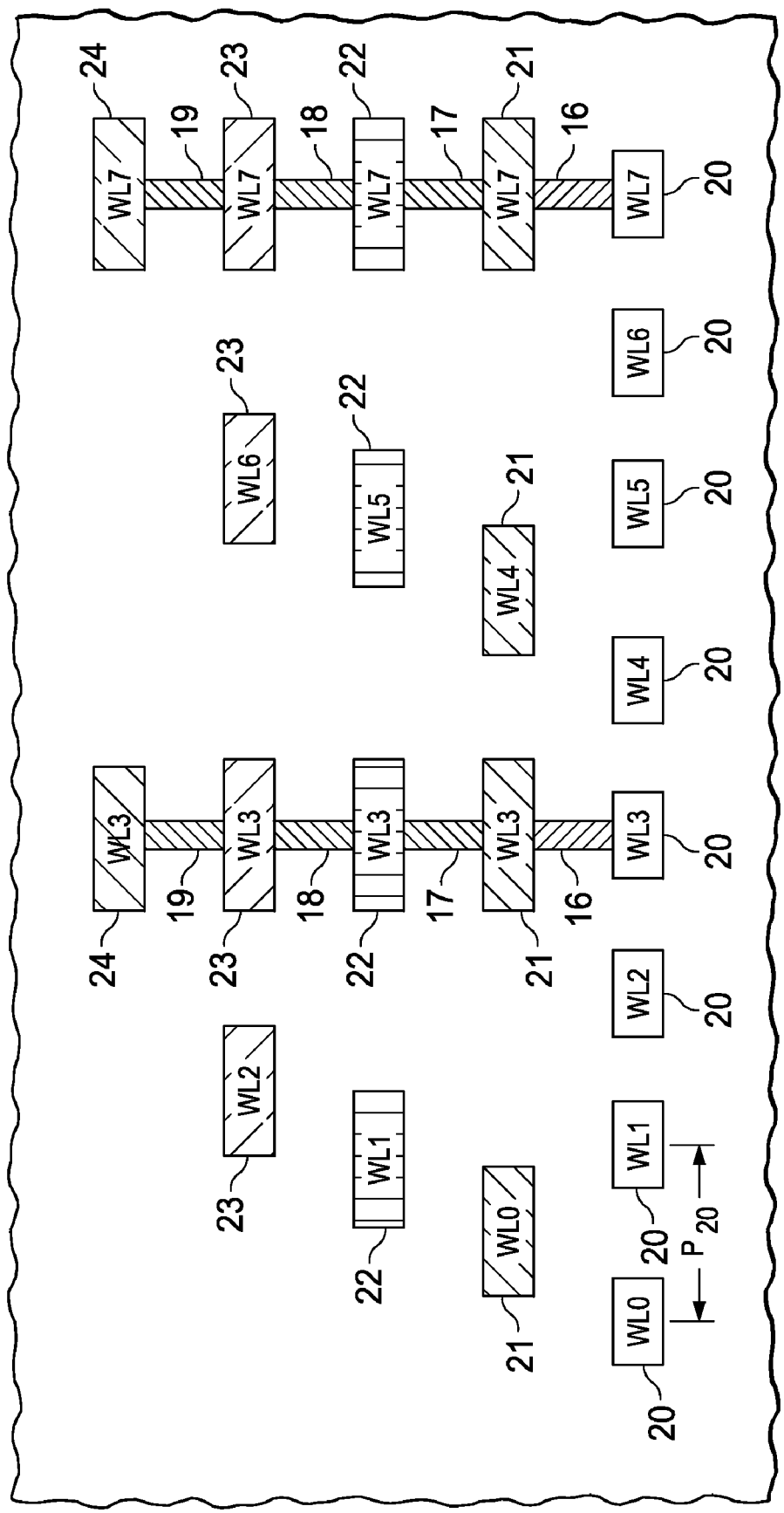

FIGS. 9b-9d illustrate contact regions formed by lateral displacement of the metal lines. For example, in FIG. 9b, (similar to FIGS. 2c and 2d), the fifth word line WL4 is disposed equidistantly between the second word line WL1 and the sixth word line WL5. Similarly, in FIG. 9c, the fifth and sixth word lines WL4 and WL5 are disposed between third and seventh word lines WL2 and WL6. Similarly, in FIG. 9d, the fifth, sixth and seventh word lines WL4, WL5 and WL6 are disposed between fourth and eighth word lines WL3 and WL7. As illustrated in FIG. 9c, in one embodiment, the fifth, sixth and seventh word lines WL4, WL5 and WL6 are not on top of each other, but are rather displaced to accommodate the needed lateral displacement (reduce bending if necessary). In other embodiments, the fifth, sixth, seventh word lines WL4, WL5 and WL6 are disposed on top of each other, and hence equidistant from the fourth and eighth word lines WL3 and WL7.

It should be understood that while the general direction of the word lines (as well as other horizontal running structures) is typically horizontal, local variations in the general direction may occur. Likewise, although the general direction of the bitlines (as well as other vertical running structures) is typically vertical, local variations may also occur. In these cases, the local intersection between a word line and a bitline may not be exactly orthogonal, as may be expected. Thus, the directions discussed herein should be understood in the general sense and are not intended to limit the inventions to absolute horizontal or vertical directions.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes and materials described herein may be varied while remaining within the scope of the present invention.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods or steps.

What is claimed is:

1. A memory cell array comprising:
    gate lines disposed over a substrate, the gate lines are disposed about parallel to each other and disposed in a same plane parallel to the substrate, the gate lines are spaced apart by a first minimum distance, wherein the gate lines are coupled to control gates of memory cells of the memory cell array;
    first metal lines disposed in a first metal level, the first metal lines coupled to a first set of the gate lines, the first metal lines spaced apart by a second minimum distance, wherein each of the first metal lines is coupled with the first set of the gate lines in at least two locations laterally separated along the length of the first set of the gate lines; and
    second metal lines disposed in a second metal level, the second metal lines coupled to a second set of the gate lines, the second metal lines spaced apart by a third minimum distance, wherein the first minimum distance is smaller than the second or third minimum distance, and wherein the gate lines are oriented along a same horizontal direction as the first metal lines and the second metal lines, the horizontal direction being a direction parallel to a major surface of the substrate.

2. The memory cell array of claim 1, wherein the first set of gate lines comprises at least two gate lines, wherein coupling each of the first metal lines is coupled with the first set of the gate lines in at least two locations comprises coupling a first of the at least two gate lines to each of the first metal lines in a first location and coupling a second of the at least two gate lines to each of the first metal lines in a second location.

3. The memory cell array of claim 1, wherein the first set of gate lines comprises a single continuous gate line.

4. A memory cell array comprising:
   gate lines disposed over a substrate, the gate lines are disposed about parallel to each other and disposed in a same plane parallel to the substrate, the gate lines are spaced apart by a first minimum distance, wherein the gate lines are coupled to control gates of memory cells of the memory cell array;
   first metal lines disposed in a first metal level, the first metal lines coupled to a first set of the gate lines, the first metal lines spaced apart by a second minimum distance, wherein each of the first metal lines is coupled with the first set of the gate lines in at least two locations laterally separated along the length of the first set of the gate lines;
   second metal lines disposed in a second metal level, the second metal lines coupled to a second set of the gate lines, the second metal lines spaced apart by a third minimum distance, wherein the first minimum distance is smaller than the second or third minimum distance, and wherein the gate lines are oriented along a same horizontal direction as the first metal lines and the second metal lines, the horizontal direction being a direction parallel to a major surface of the substrate; and
   third metal lines disposed in a third metal level, the third metal lines spaced apart by a fourth minimum distance, wherein the first minimum distance is smaller than the fourth minimum distance.

* * * * *